United States Patent
Yeh

(10) Patent No.: US 11,211,302 B2
(45) Date of Patent: Dec. 28, 2021

(54) SEMICONDUCTOR DEVICE PACKAGE

(71) Applicant: Advanced Semiconductor Engineering, Inc., Kaohsiung (TW)

(72) Inventor: Chang-Lin Yeh, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 16/656,338

(22) Filed: Oct. 17, 2019

(65) Prior Publication Data

US 2021/0118760 A1    Apr. 22, 2021

(51) Int. Cl.
| | |
|---|---|
| *H01L 23/31* | (2006.01) |
| *H01L 23/498* | (2006.01) |
| *H01L 23/00* | (2006.01) |
| *H05K 3/28* | (2006.01) |

(52) U.S. Cl.
CPC .... *H01L 23/3192* (2013.01); *H01L 23/49816* (2013.01); *H01L 23/49833* (2013.01); *H01L 24/17* (2013.01); *H01L 24/33* (2013.01); *H05K 3/284* (2013.01); *H05K 2201/09036* (2013.01)

(58) Field of Classification Search
CPC . H01L 23/3192; H01L 23/3157; H01L 24/33; H01L 23/055; H01L 23/053; H01L 23/04; H01L 23/66; H01L 24/17; H01L 23/49816; H01Q 1/2283; H05K 3/284; H05K 2201/09036; H05K 1/0218
See application file for complete search history.

(56) References Cited

U.S. PATENT DOCUMENTS

| | | | | |
|---|---|---|---|---|
| 2012/0153495 | A1* | 6/2012 | Mallik | H01L 23/49838 257/774 |
| 2013/0292808 | A1* | 11/2013 | Yen | H01L 23/5227 257/660 |
| 2015/0271959 | A1* | 9/2015 | Chen | H05K 3/284 361/760 |
| 2018/0130758 | A1* | 5/2018 | Chiang | H01L 23/3121 |
| 2019/0139786 | A1 | 5/2019 | Yeh | |
| 2020/0083132 | A1* | 3/2020 | Huang | H01L 21/568 |

FOREIGN PATENT DOCUMENTS

CN    104347558 A    2/2015

OTHER PUBLICATIONS

Wikipedia, Printed circuit board, archived Jan. 13, 2018 (Year: 2018).*

* cited by examiner

*Primary Examiner* — Shih Tsun A Chou
(74) *Attorney, Agent, or Firm* — Foley & Lardner LLP

(57) ABSTRACT

A semiconductor device package comprises a carrier, a stop layer, a barrier layer and an encapsulant. The carrier has a first surface and a second surface recessed with respect to the first surface. The stop layer is disposed on the second surface of the carrier. The barrier layer is disposed on the stop layer and protruded from the first surface of the carrier. The encapsulant is disposed on the first surface of the carrier. Further, the encapsulant has a side surface disposed on the barrier layer.

19 Claims, 20 Drawing Sheets

SEMICONDUCTOR DEVICE PACKAGE

BACKGROUND

1. Technical Field

The instant disclosure relates to, amongst other things, a semiconductor device package, and a semiconductor device package having an area or space devoid of an encapsulating material.

2. Description of Related Art

A molding process is a packaging technology for a semiconductor package, which is used to protect a substrate and components on the substrate. However, in some implementations not all regions of the substrate should be covered by the encapsulating material (also referred to as a molding compound), such as in antenna-on-package (AoP) implementations, in which it may be desirable to perform impedance matching of a path from a component to an antenna. Thus, a semiconductor device package can have a non-molding area or space (an area or space devoid of the encapsulating material), and a user can readily adjust the impedance matching by adjusting surface mount technology (SMT) passive components after the molding process.

SUMMARY

According to one example embodiment of the instant disclosure, a semiconductor device package comprises a carrier, a stop layer, a barrier layer and an encapsulant. The carrier has a first surface and a second surface recessed with respect to the first surface. The stop layer is disposed on the second surface of the carrier. The barrier layer is disposed on the stop layer and protruded from the first surface of the carrier. The encapsulant is disposed on the first surface of the carrier. Further, the encapsulant has a side surface disposed on the barrier layer.

According to another example embodiment of the instant disclosure, a semiconductor device package comprises a carrier, a stop layer, a first barrier layer and an encapsulant. The carrier has a first surface and a second surface recessed with respect to the first surface. The stop layer is disposed on the second surface of the carrier. The first barrier layer is disposed on the stop layer and has a third surface coplanar with the first surface or recessed with respect to the first surface. The encapsulant is disposed on the first surface of the carrier. Further, the encapsulant has a side surface disposed on the third surface of the barrier layer.

According to another example embodiment of the instant disclosure, a semiconductor device package comprises a carrier, a stop layer and an encapsulant. The carrier has a first surface, a second surface recessed with respect to the first surface and a third surface connected the first surface. The stop layer is disposed on the second surface of the carrier. The encapsulant is disposed on the first surface of the carrier. The third surface of the carrier is disposed on the stop layer and the encapsulant has a side surface coplanar with the third surface of the carrier.

In order to further understand the instant disclosure, the following embodiments are provided along with illustrations to facilitate appreciation of the instant disclosure; however, the appended drawings are merely provided for reference and illustration, without any intention to limit the scope of the instant disclosure.

DETAILED DESCRIPTION

The aforementioned illustrations and following detailed descriptions are by example for the purpose of further explaining the scope of the instant disclosure. Other objectives and advantages related to the instant disclosure will be illustrated in the subsequent descriptions and appended drawings.

Figure 1:
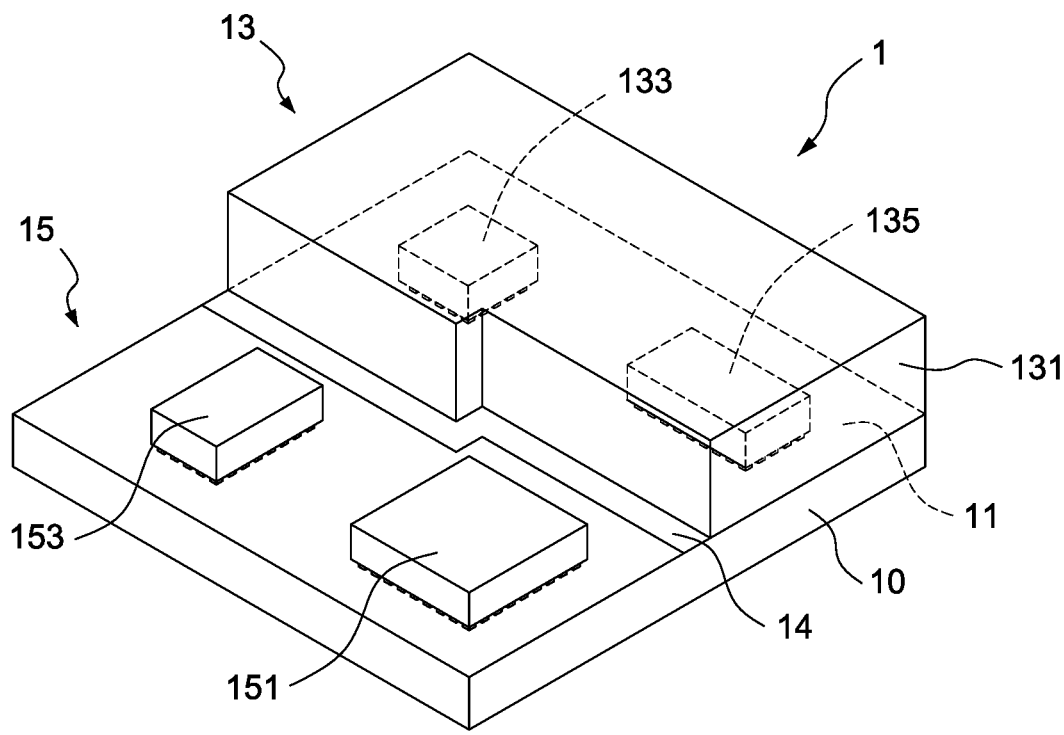
FIG. 1 is a schematic perspective view of a semiconductor device package in accordance with an embodiment of the instant disclosure.

FIG. 1 shows a semiconductor device package 1 in accordance with an embodiment of the instant disclosure. In particular, the semiconductor device package 1 may have a molding area 13 and a non-molding area 15. As used herein, the term "molding area" can refer to an area (e.g. an area of a substrate) covered by the molding material, and the term "non-molding area" can refer to an area (e.g. an area of a substrate) or a space substantially devoid of molding material. With reference to FIG. 1, the semiconductor device package 1 may comprise a carrier 10. The carrier 10 has an upper surface 11. An encapsulating material 131 may be disposed on the upper surface 11 of the carrier 10. A die 133 and a component 135 (e.g., an electronic component, such as a passive electronic component) are disposed on the upper surface 11 of the carrier 10 and covered by the encapsulating material 131. As shown in FIG. 1, the area covered by the encapsulating material 131 is the molding area 13. Further, referring to FIG. 1, a region of the upper surface 11 of the carrier 10 is exposed from the encapsulating material 131 (e.g., are substantially devoid of the encapsulating material 131). The region exposed from the encapsulating material 131 is the non-molding area 15. In the non-molding area 15, there is substantially no encapsulating material 131 disposed on the upper surface 11 of the carrier 10, and the die 151 and the component 153 disposed on the upper surface 11 of the carrier 10 are not covered by the encapsulating material 131 and thus are exposed. Further, a conductive layer 14 is disposed on the upper surface 11 of the carrier 10. The conductive layer 14 may comprise a stop layer or comprise a stop layer and a barrier layer. The conductive layer 14 may be substantially located at or/and extend along the interface between the molding area 13 and the non-molding area 15. That is, the conductive layer 14 may be substantially located between the molding area 13 and the non-molding area 15. Referring to FIG. 1, the conductive layer 14 looks like a zigzag strip, and the molding area 13 and the non-molding area 15 are separated from each other by the zigzag strip.

Figure 2:
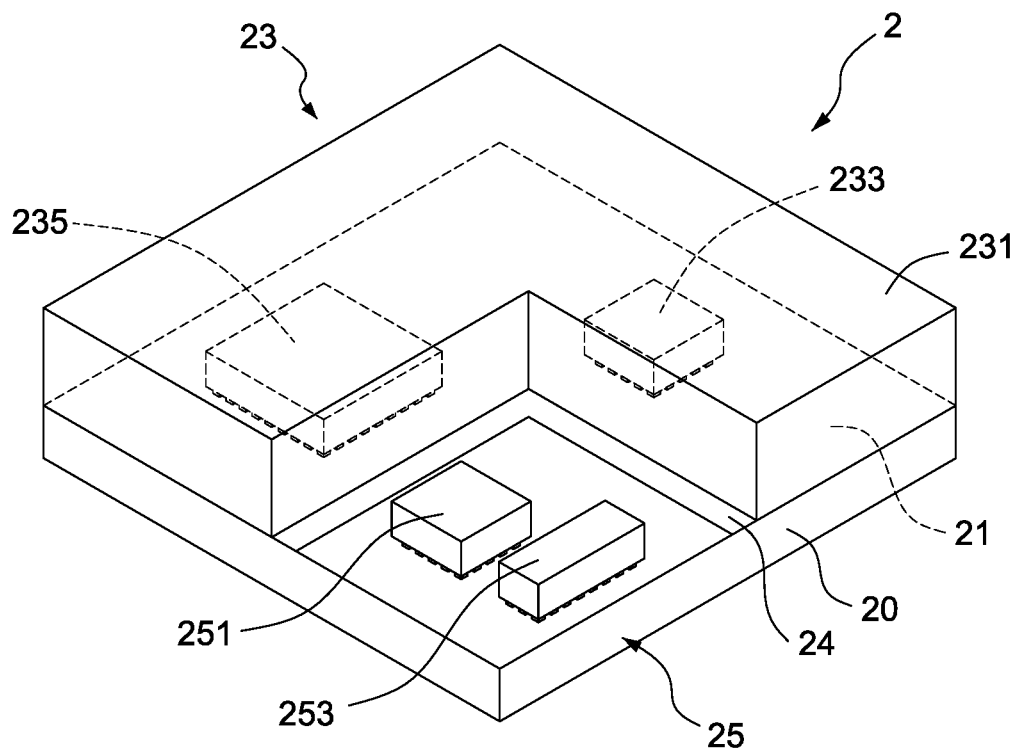
FIG. 2 is a schematic perspective view of a semiconductor device package in accordance with another embodiment of the instant disclosure.

FIG. 2 shows a semiconductor device package 2 in accordance with an embodiment of the instant disclosure. In particular, the semiconductor device package 2 may have a molding area 23 and a non-molding area 25. As used herein, the term "molding area" can refer to an area (e.g. an area of a substrate) covered by the molding material, and the term "non-molding area" can refer to an area (e.g. an area of a substrate) or a space substantially devoid of molding material. With reference to FIG. 2, the semiconductor device package 2 may comprise a carrier 20. The carrier 20 has an upper surface 21. An encapsulating material 231 may be disposed on the upper surface 21 of the carrier 20. A die 233 and a component 235 (e.g., an electronic component, such as a passive electronic component) are disposed on the upper surface 21 of the carrier 20 and covered by the encapsulating material 231. As shown in FIG. 2, the area covered by the encapsulating material 231 is the molding area 23. Further, referring to FIG. 2, a region of the upper surface 21 of the carrier 20 is exposed from the encapsulating material 231 (e.g., are substantially devoid of the encapsulating material 231). The region exposed from the encapsulating material 231 is the non-molding area 25. In the non-molding area 25, there is substantially no encapsulating material 231 disposed on the upper surface 21 of the carrier 20, and the die 251 and the component 253 disposed on the upper surface 21 of the carrier 20 are not covered by the encapsulating material 231 and thus are exposed. In addition, a connector may be disposed on the upper surface 21 of the carrier 20 and not be covered by the encapsulating material 231 (not shown), wherein the connector may electrically connect to the external component by the Flexible Printed Circuit board (FPC board). Further, a conductive layer 24 is disposed on the upper surface 21 of the carrier 20. The conductive layer 24 may comprise a stop layer or comprise a stop layer and a barrier layer. The conductive layer 24 may be substantially located at or/and extend along the interface between the molding area 23 and the non-molding area 25. That is, the conductive layer 24 may be substantially located between the molding area 23 and the non-molding area 25. Referring to FIG. 2, two ends of the conductive layer 24 are respectively located at two adjacent sides 201, 202 of the carrier 20. Thus, the non-molding area 25 is substantially located at the corner of the upper surface 11 of the carrier 10.

Figure 3:
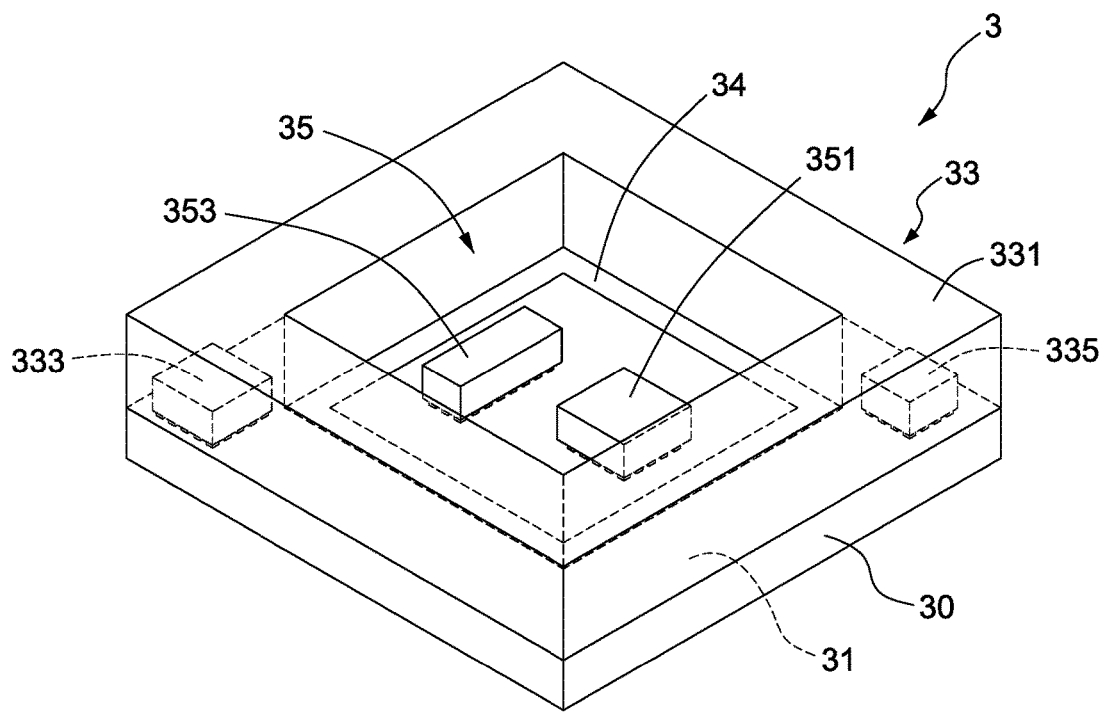
FIG. 3 is a schematic perspective view of a semiconductor device package in accordance with another embodiment of the instant disclosure.

FIG. 3 shows a semiconductor device package 3 in accordance with an embodiment of the instant disclosure. In particular, the semiconductor device package 3 may have a molding area 33 and a non-molding area 35. As used herein, the term "molding area" can refer to an area (e.g. an area of a substrate) covered by the molding material, and the term "non-molding area" can refer to an area (e.g. an area of a substrate) or a space substantially devoid of molding material. With reference to FIG. 3, the semiconductor device package 3 may comprise a carrier 30. The carrier 30 has an upper surface 31. An encapsulating material 331 may be disposed on the upper surface 31 of the carrier 30. A die 333 and a component 335 (e.g., an electronic component, such as a passive electronic component) are disposed on the upper surface 31 of the carrier 30 and covered by the encapsulating material 331. As shown in FIG. 3, the area covered by the encapsulating material 331 is the molding area 33. Further, referring to FIG. 3, a region of the upper surface 31 of the carrier 30 is exposed from the encapsulating material 331 (e.g., are substantially devoid of the encapsulating material 331). The region exposed from the encapsulating material 331 is the non-molding area 35. In the non-molding area 35, there is substantially no encapsulating material 331 disposed on the upper surface 31 of the carrier 30, and the die 351 and the component 353 disposed on the upper surface 31 of the carrier 30 are not covered by the encapsulating material 331 and thus are exposed. Further, a conductive layer 34 is disposed on the upper surface 31 of the carrier 30. The conductive layer 34 may comprise a stop layer or comprise a stop layer and a barrier layer. The conductive layer 34 may be substantially located at or/and extend along the interface between the molding area 33 and the non-molding area 35. That is, the conductive layer 34 may be substantially located between the molding area 33 and the non-molding area 35. Referring to FIG. 3, the conductive layer 34 is ring-shaped. Thus, the non-molding area 35 is substantially surrounded by the molding area 33.

Figure 4A:
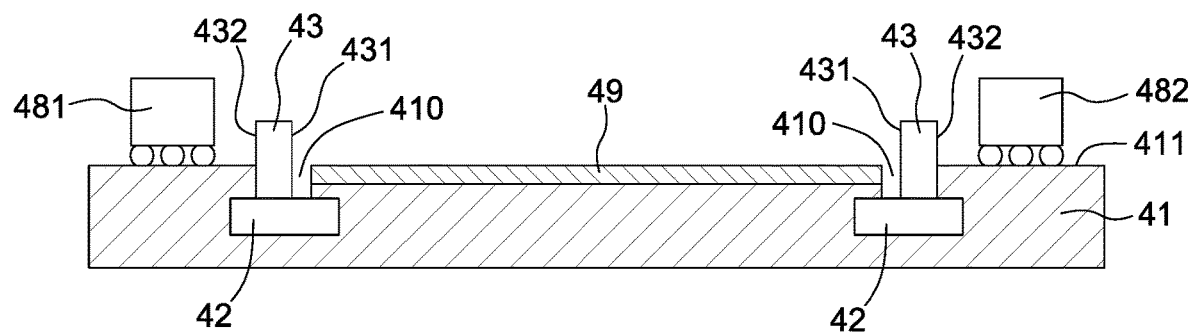
FIG. 4A, FIG. 4B, FIG. 4C, FIG. 4D, FIG. 4E and FIG. 4F show a method of manufacturing a semiconductor device package in accordance with an embodiment of the instant disclosure.
Figure 4B:
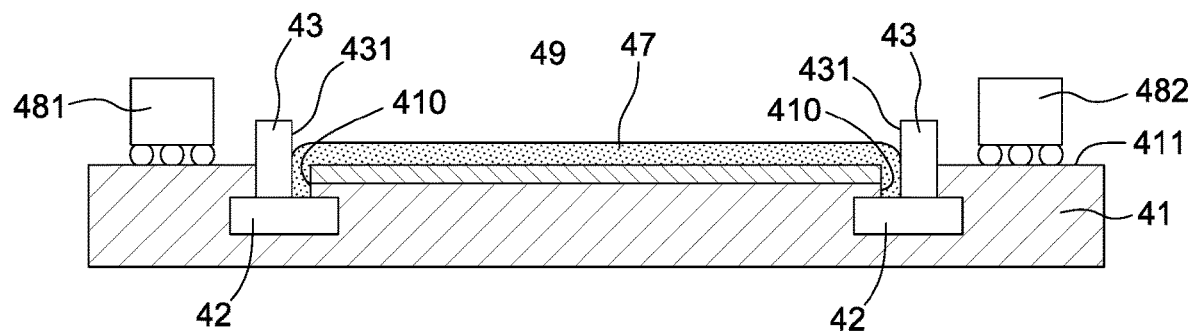
Figure 4C:
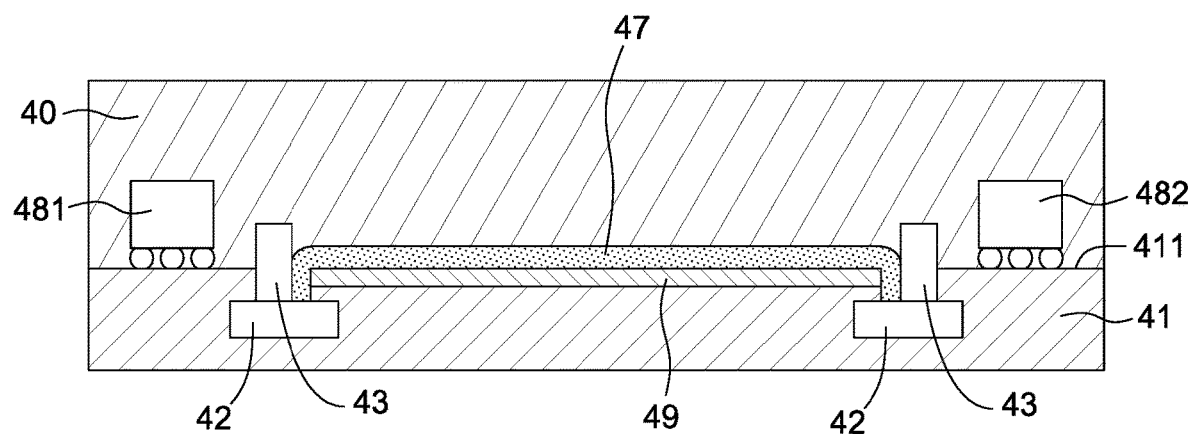
Figure 4D:
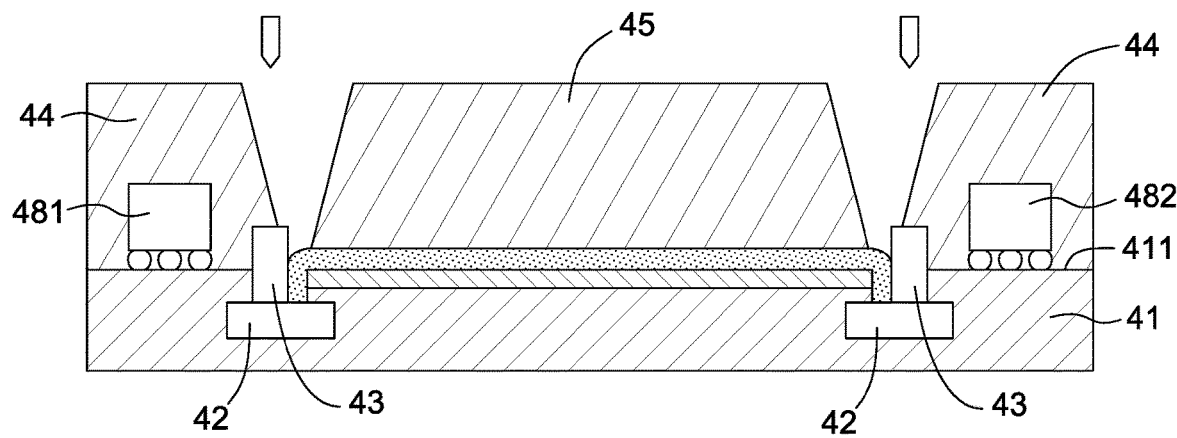
Figure 4E:
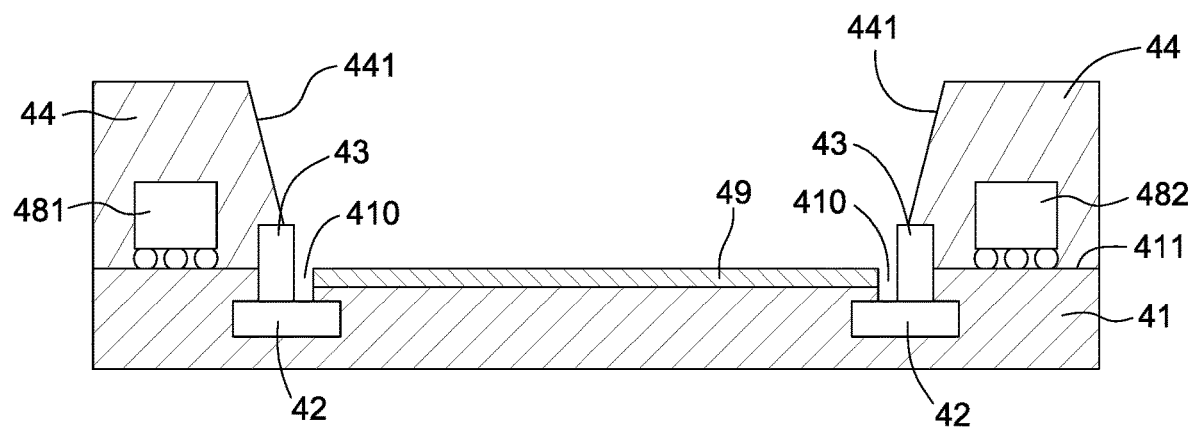
Figure 4F:
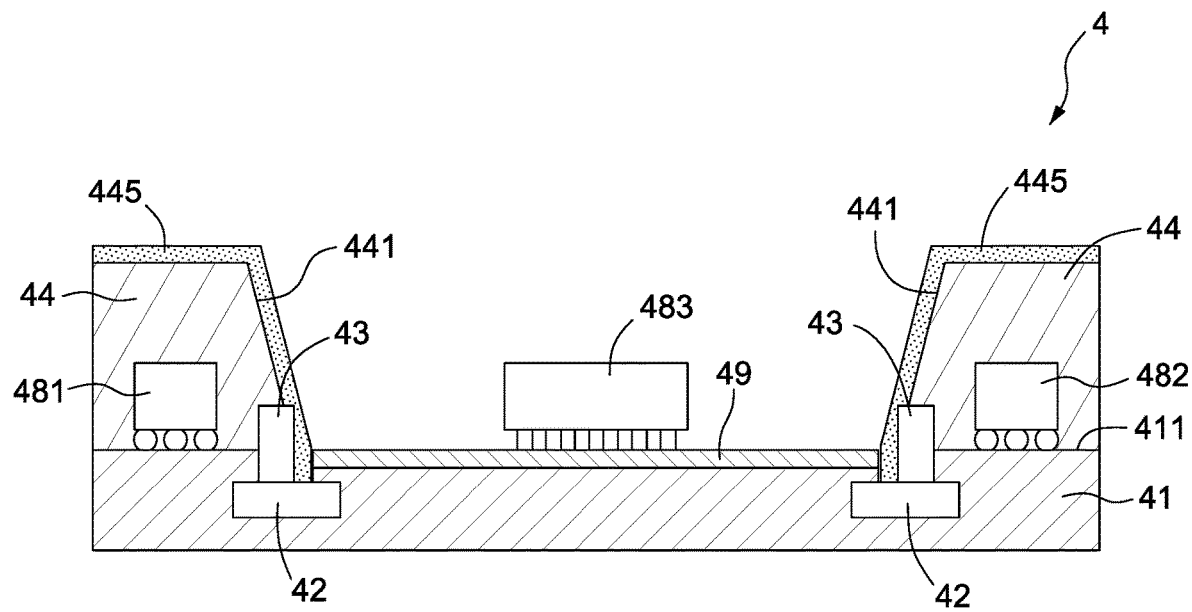

FIG. 4A, FIG. 4B, FIG. 4C, FIG. 4D, FIG. 4E and FIG. 4F show a method of manufacturing a semiconductor device package 4 (as shown in FIG. 4F) in accordance with an embodiment of the instant disclosure. As shown in FIG. 4A, a carrier 41 has an upper surface 411 and two recesses 410 formed in the upper surface 411. The carrier 41 may have recessed surfaces 412 (e.g. that defines a bottom of the recess 410) recessed with respect to the upper surface 411. Stop layers 42 may be respectively received within the recesses 410 and thus respectively disposed on the recessed surfaces 412. In other words, the stop layer 42 may be embedded in the carrier 41. A barrier layer 43 may be disposed on the stop layer 42 and protruded from the upper surface 411 of the carrier 41. The barrier layer 43 and the stop layer 42 may be integrated with each other. Moreover, the stop layer 42 and the barrier layer 43 may be made of the same material. Referring to FIG. 4A, the cross-sectional width of the stop layer 42 is greater than the cross-sectional width of the barrier layer 43. Especially, the combination of the stop layer 42 and the barrier layer 43 may be substantially inverted T-shaped. At least two electronic components 481, 482 are disposed on the upper surface 411 of the carrier 41.

As shown in FIG. 4A, the barrier layer 43 may have a side surface 431 connecting to the upper surface 421 of the stop layer 42. Further, there may be a space between the side surface 431 of the barrier layer 43 and the carrier 41. In addition, the barrier layer 43 may further have a side surface 432 opposite to the side surface 431. At least a portion of the side surface 432 may be substantially attached to the carrier 41. Moreover, a portion of the upper surface 411 of the carrier 41, which is located between the recesses 410, may further comprise a wetting layer 49.

Further, with reference to FIG. 4B, a glue is dispensed on the portion of the upper surface 411 of the carrier 41 between recesses 410. Since the barrier layers 43 are protruded from the upper surface 411 of the carrier 41, the glue will not flow across the barriers 43. That is, the removable/sacrificial layer 47 will be formed between the barriers 43. Further, the glue may flow into the space between the side surface 431 of the barrier layer 43 and the carrier 41. In addition, since the portion of the upper surface 411 of the carrier 41 between the recesses 410 may further comprise the wetting layer 49, the glue will be smoothly distributed and the removable/sacrificial layer 47 will be evenly formed between the barriers 43.

With reference to FIG. 4C, an encapsulating material 40 is disposed on the carrier 41 and encapsulates the upper surface 411 of the carrier 41, the stop layers 42, the barrier layers 43, the removable/sacrificial layer 47 and the components 481, 482. That is, the encapsulating material 40 covers the upper surface 411 of the carrier 41, the stop layers 42, the barrier layers 43, the removable/sacrificial layer 47 and the components 481 and 482.

With reference to FIG. 4D, portions of the encapsulating material 40 are removed by a laser process and thus portions of the barrier layers 43 are exposed. Thereby, the encapsulating material 40 is divided into three portions 44 and 45, wherein the portions of the encapsulating material 44 are attached to the upper surface 411 of the carrier 41 and the barrier layers 43 and the portion of the encapsulating material 45 is attached to the removable/sacrificial layer 47. In particular, while removing the portions of the encapsulating material 40 by the laser process, the laser will be projected on the barrier layers 43 or on the barrier layers 43 and the stop layers 42 and thus will not damage the carrier 41.

With reference to FIG. 4E, the removable/sacrificial layer 47 is removed by physical methods or chemical methods, such as a water washing process. Further, the portion of the encapsulating material 45 attached to the removable/sacrificial layer 47 is removed (e.g. while removing the removable/sacrificial layer 47). After removing the removable/sacrificial layer 47 and the portion of the encapsulating material 45, the portions of the encapsulating material 44 remain on the carrier 41 and the portion of the upper surface 41 between the recesses 410 and the wetting layer 49 are exposed. Moreover, a portion of the barrier layer 43 which is protruded from the upper surface 411 of the carrier 41, such as the portion of the side surface 431 above the upper surface 411 of the carrier 41, will be exposed as well. Further, the portions of the encapsulating material 44 are disposed on the upper surface 411 of the carrier 41.

As shown in FIG. 4E, the portion of the encapsulating material 44 may have a side surface 441 standing on the barrier layer 43. In addition, the glue may flow into the space between the side surface 431 of the barrier layer 43 and the carrier 41. Thus, after removing removable/sacrificial layer 47, the entirety of the side surface 431 of the barrier 41 may be exposed.

With reference to FIG. 4F, at least one electronic component 483 is disposed on the portion of the upper surface 41 between the recesses 410. Further, a shielding layer 445 may be formed on the portion of the encapsulating material 44 and connected to the stop layer 42 and the barrier layer 43. The shielding layer 445 may be grounded by the stop layer 42 and barrier layer 43.

Figure 5A:
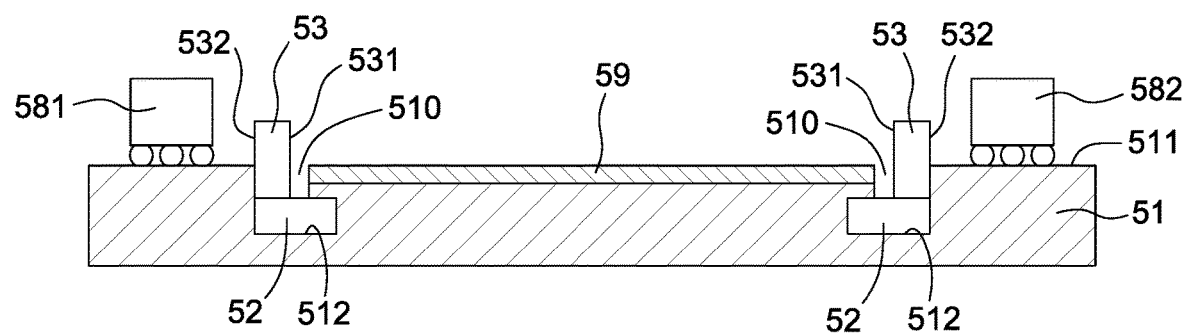
FIG. 5A, FIG. 5B, FIG. 5C, FIG. 5D, FIG. 5E and FIG. 5F show a method of manufacturing a semiconductor device package in accordance with an embodiment of the instant disclosure.
Figure 5B:
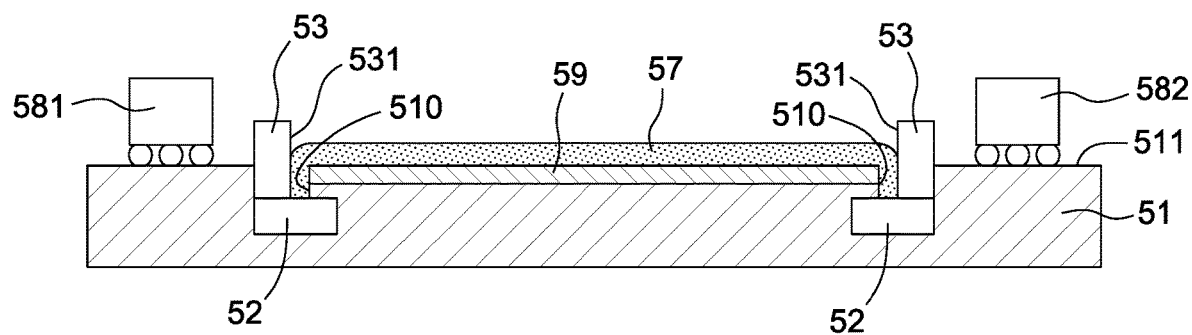
Figure 5C:
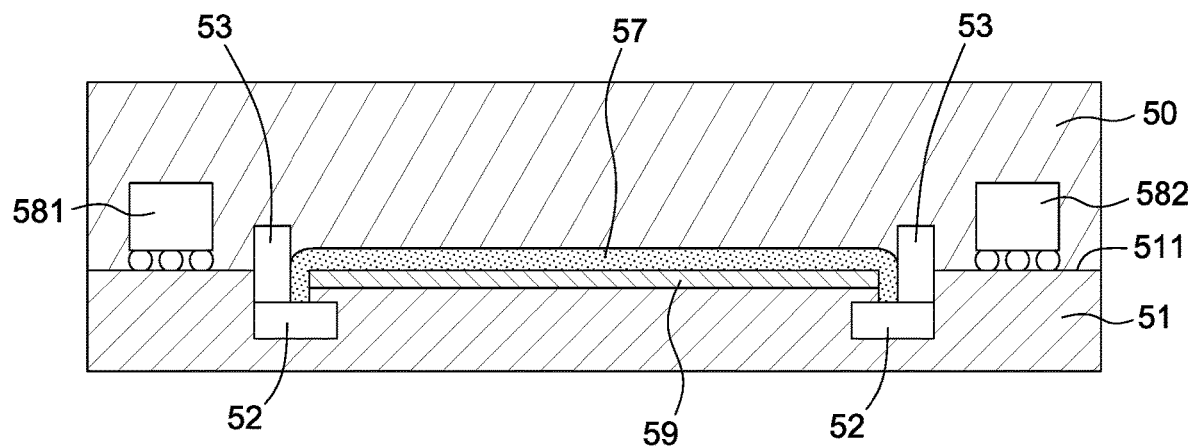
Figure 5D:
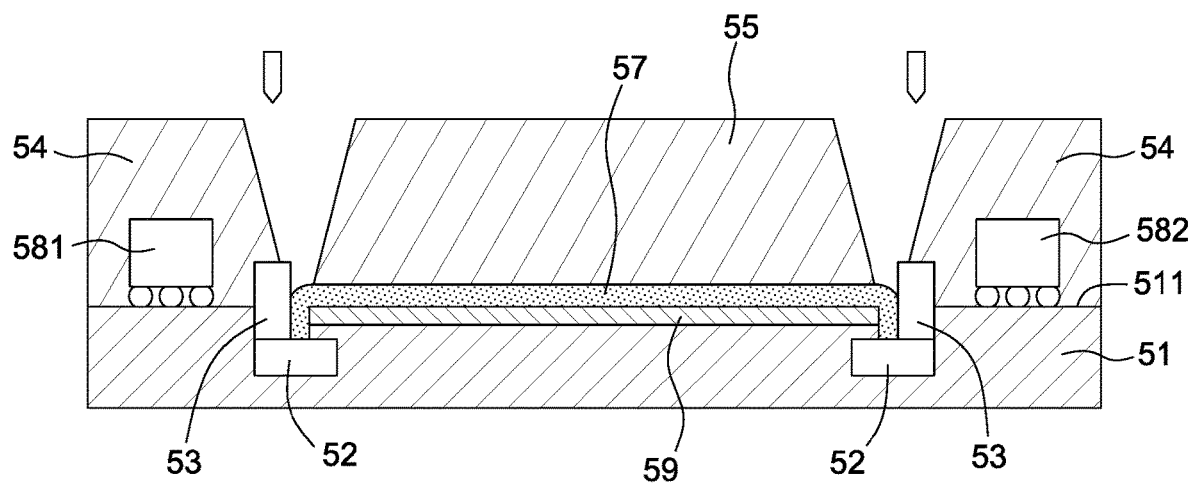
Figure 5E:
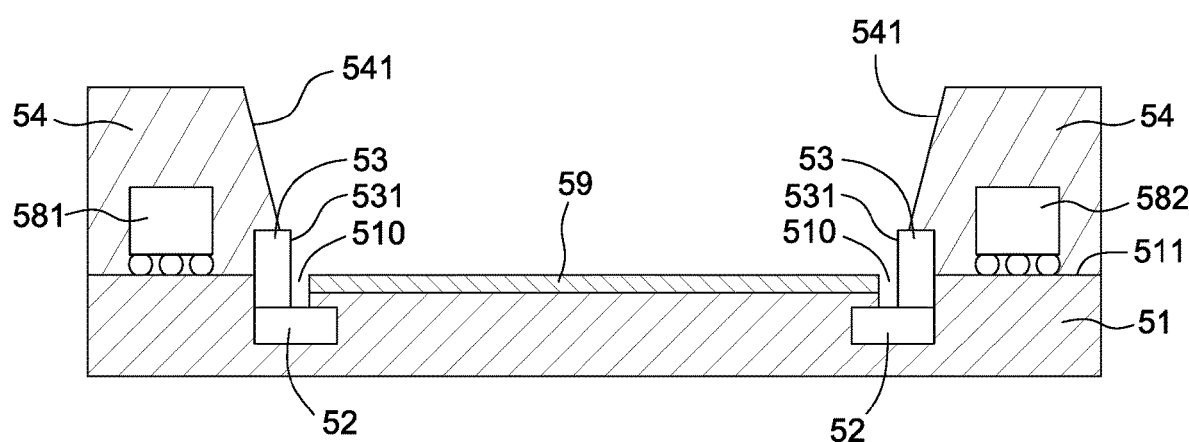
Figure 5F:
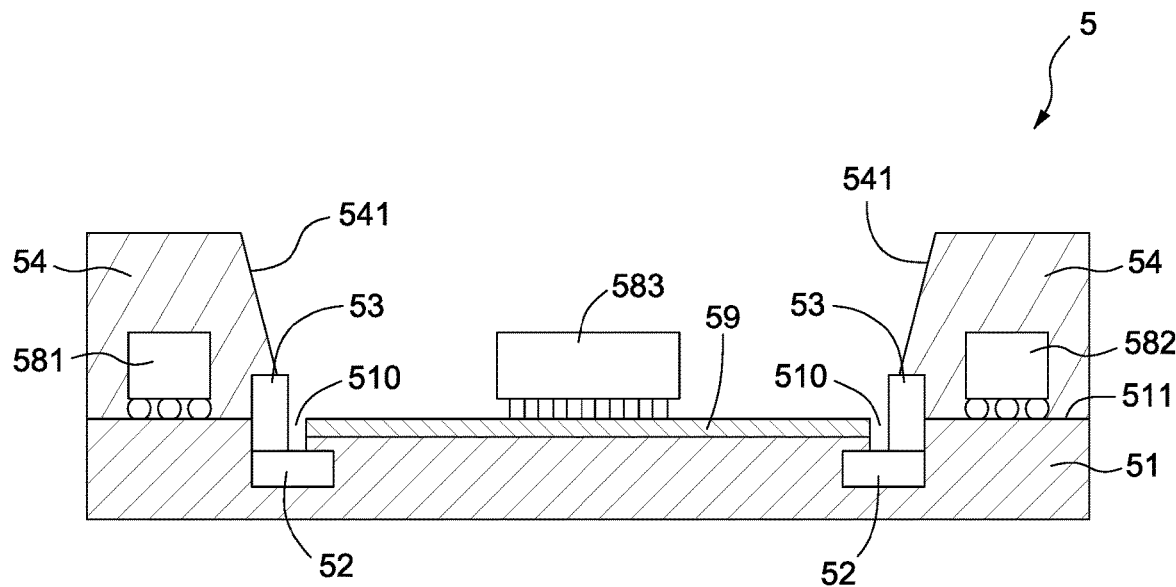

FIG. 5A, FIG. 5B, FIG. 5C, FIG. 5D, FIG. 5E and FIG. 5F show a method of manufacturing a semiconductor device package 5 (as shown in FIG. 5F) in accordance with another embodiment of the instant disclosure. As shown in FIG. 5A, a carrier 51 has an upper surface 511 and two recesses 510 formed in the upper surface 511. The carrier 51 may have recessed surfaces 512 (e.g. that defines a bottom of the recess 510) recessed with respect to the upper surface 511. Stop layers 52 may be respectively received within the recesses 510 and thus respectively disposed on the recessed surfaces 512. In other words, the stop layer 52 may be embedded in the carrier 51. A barrier layer 53 may be disposed on the stop layer 52 and protruded from the upper surface 511 of the carrier 51. The barrier layer 53 and the stop layer 52 may be integrated with each other. Moreover, the stop layer 52 and the barrier layer 53 may be made of the same material. Referring to FIG. 5A, the cross-sectional width of the stop layer 52 is greater than the cross-sectional width of the barrier layer 53. Especially, the combination of the stop layer 52 and the barrier layer 53 may be substantially L-shaped. At least two electronic components 581, 582 are disposed on the upper surface 511 of the carrier 51.

As shown in FIG. 5A, the barrier layer 53 has a side surface 531 connecting to the upper surface 521 of the stop layer 52. Further, there may be a space between the side surface 531 of the barrier layer 53 and the carrier 51. In addition, the barrier layer 53 may further have a side surface 532 opposite to the side surface 531. At least a portion of the side surface 532 may be substantially attached to the carrier 51. Moreover, a portion of the upper surface 511 of the carrier 51, which is located between the recesses 510, may further comprise a wetting layer 59.

Further, with reference to FIG. 5B, a glue is dispensed on the portion of the upper surface 511 of the carrier 51 between recesses 510. Since the barrier layers 53 are protruded from the upper surface 511 of the carrier 51, the glue will not flow across the barriers 53. That is, the removable/sacrificial layer 57 will be formed between the barriers 53. Further, the glue may flow into the space between the side surface 531 of the barrier layer 53 and the carrier 51. In addition, since the portion of the upper surface 511 of the carrier 51 between the recesses 510 may further comprise the wetting layer 59, the glue will be smoothly distributed and the removable/sacrificial layer 57 will be evenly formed between the barriers 53.

With reference to FIG. 5C, an encapsulating material 50 is disposed on the carrier 51 and encapsulates the upper surface 511 of the carrier 51, the stop layers 52, the barrier layers 53, the removable/sacrificial layer 57 and the components 581, 582. That is, the encapsulating material 50 covers the upper surface 511 of the carrier 51, the stop layers 52, the barrier layers 53, the removable/sacrificial layer 57 and the components 581, 582.

With reference to FIG. 5D, portions of the encapsulating material 50 are removed by a laser process and thus portions of the barrier layers 53 are exposed. Thereby, the encapsulating material 50 is divided into three portions 54 and 55, wherein the portions of the encapsulating material 54 are attached to the upper surface 511 of the carrier 51 and the barrier layers 53 and the portion of the encapsulating material 55 is attached to the removable/sacrificial layer 57. In particular, while removing the portions of the encapsulating material 50 by the laser process, the laser will be projected on the barrier layers 53 or on the barrier layers 53 and the stop layers 52 and will not damage the carrier 51.

With reference to FIG. 5E, the removable/sacrificial layer 57 is removed by physical methods or chemical methods, such as a water washing process. Further, the portion of the encapsulating material 55 attached to the removable/sacrificial layer 57 is removed (e.g. while removing the removable/sacrificial layer 57). After removing the removable/sacrificial layer 57 and the portion of the encapsulating material 55, the portions of the encapsulating material 54 remain on the carrier 41 and the portion of the upper surface 51 between the recesses 510 and the wetting layer 59 are exposed. Moreover, a portion of the barrier layer 53 which is protruded from the upper surface 511 of the carrier 51, such as the portion of the side surface 531 above the upper surface 511 of the carrier 51, will be exposed as well.

Further, the portions of the encapsulating material 54 are disposed on the upper surface 511 of the carrier 51.

As shown in FIG. 5E, the portion of the encapsulating material 54 may have a side surface 541 standing on the barrier layer 53. In addition, the glue may flow into the space between the side surface 531 of the barrier layer 53 and the carrier 51. Thus, after removing removable/sacrificial layer 57, the entirety of the side surface 531 of the barrier 51 may be exposed.

With reference to FIG. 5F, at least one electronic component 583 is disposed on the portion of the upper surface 51 between the recesses 510.

Figure 6A:
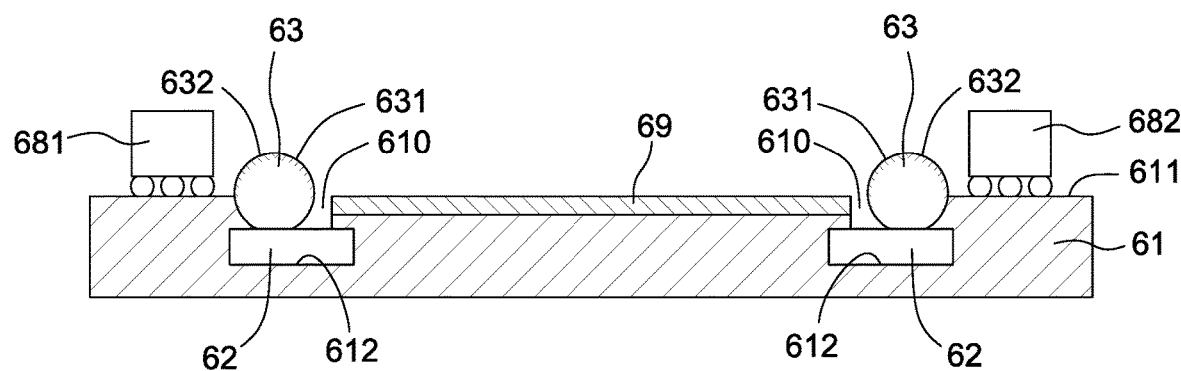
FIG. 6A, FIG. 6B, FIG. 6C, FIG. 6D, FIG. 6E and FIG. 6F show a method of manufacturing a semiconductor device package in accordance with an embodiment of the instant disclosure.
Figure 6B:
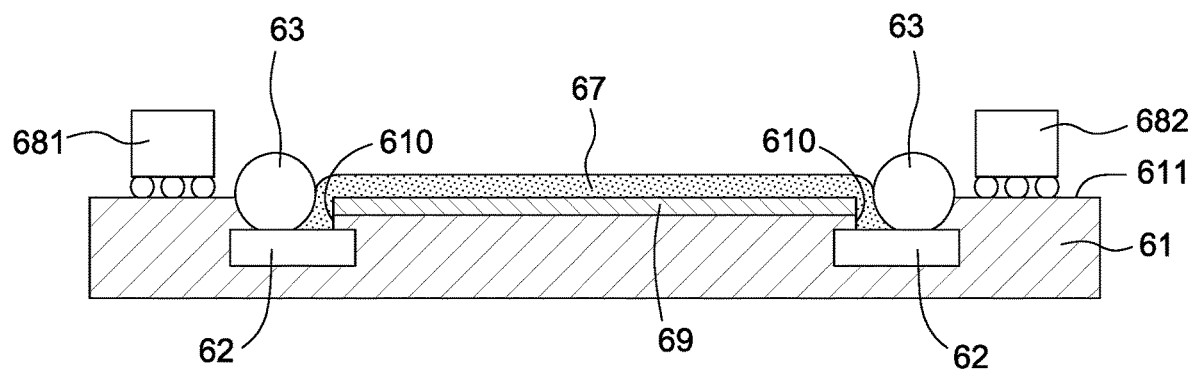
Figure 6C:
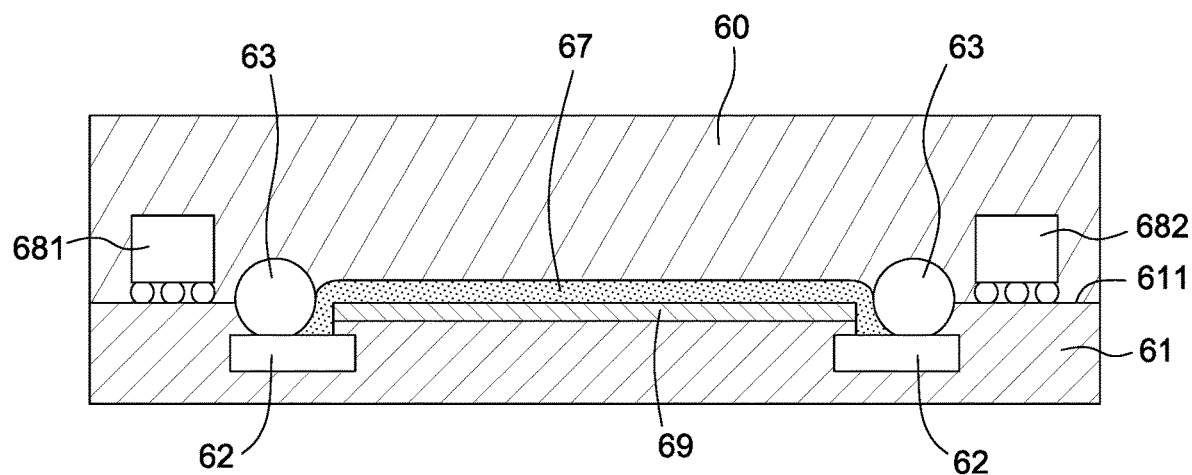
Figure 6D:
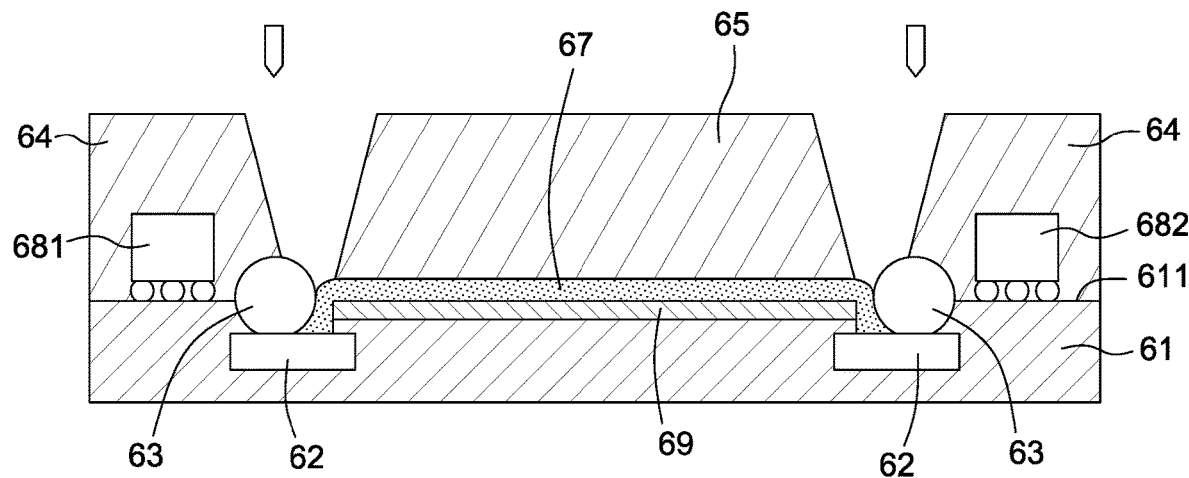
Figure 6E:
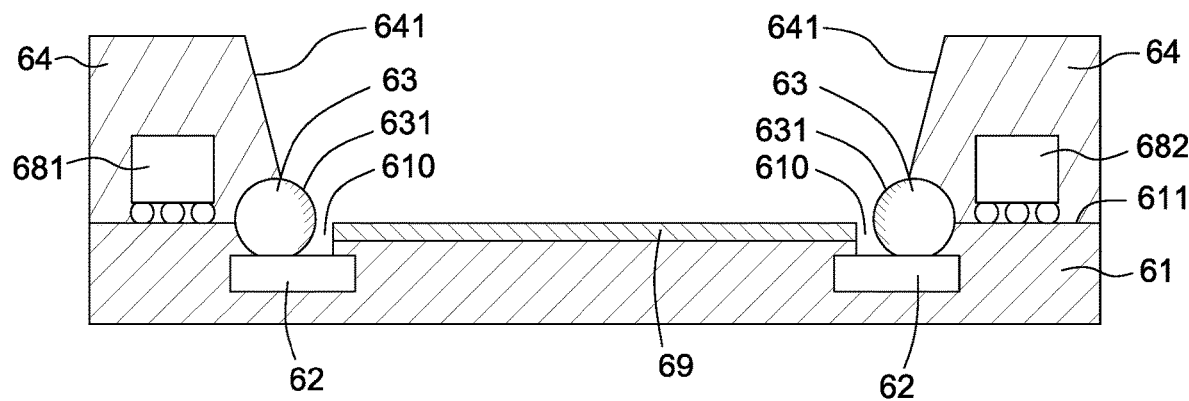
Figure 6F:
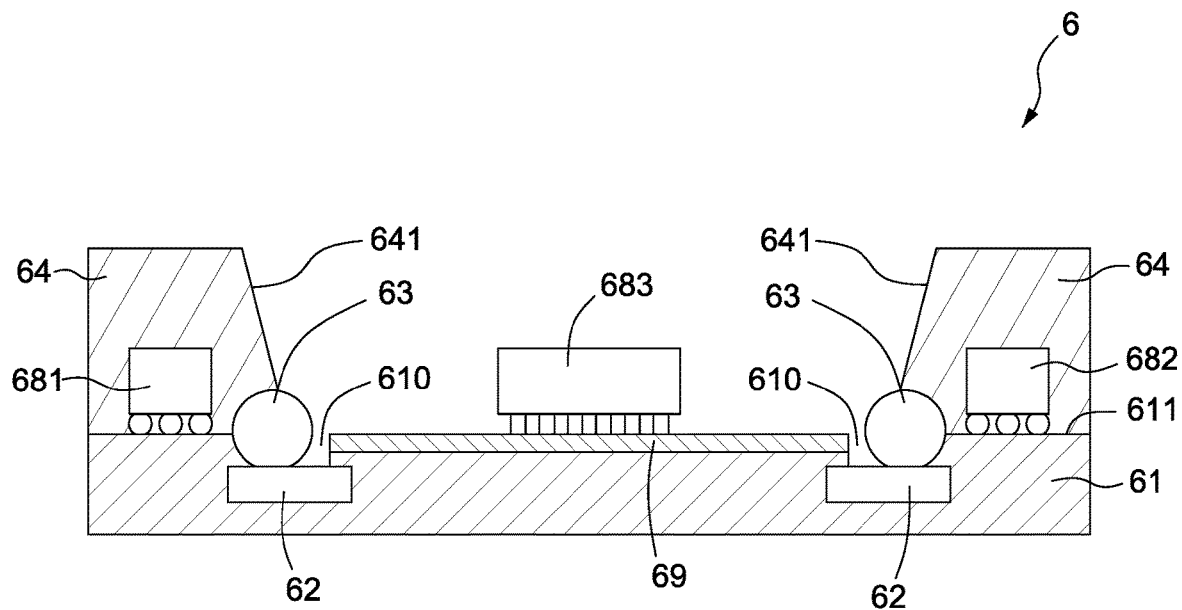

FIG. 6A, FIG. 6B, FIG. 6C, FIG. 6D, FIG. 6E and FIG. 6F show a method of manufacturing a semiconductor device package 6 (as shown in FIG. 6F) in accordance with another embodiment of the instant disclosure. As shown in FIG. 6A, a carrier 61 has an upper surface 611 and two recesses 610 formed in the upper surface 611. The carrier 61 may have recessed surfaces 612 (e.g. that defines a bottom of the recess 610) recessed with respect to the upper surface 611. Stop layers 62 may be respectively received within the recesses 610 and thus respectively disposed on the recessed surfaces 612. In other words, the stop layer 62 may be embedded in the carrier 61. A barrier layer 63 may be disposed on the stop layer 62 and protruded from the upper surface 611 of the carrier 61. Moreover, the stop layer 62 may be a pad and the barrier layer 63 may consist of the solder balls. Referring to FIG. 6A, the cross-sectional width of the stop layer 62 is greater than the largest cross-sectional width of the barrier layer 63. At least two electronic components 681, 682 are disposed on the upper surface 611 of the carrier 61.

As shown in FIG. 6A, the barrier layer 63 has a side surface 631 connecting to the upper surface 621 of the stop layer 62. Further, there may be a space between the side surface 631 of the barrier layer 63 and the carrier 61. In addition, a portion of the upper surface 611 of the carrier 61, which is located between the recesses 610, may further comprise a wetting layer 69.

Further, with reference to FIG. 6B, a glue is dispensed on the portion of the upper surface 611 of the carrier 61 between recesses 610. Since the barrier layers 63 are protruded from the upper surface 611 of the carrier 61, the glue will not flow across the barriers 63. That is, the removable/sacrificial layer 67 will be formed between the barriers 63. Further, the glue may flow into the space between the side surface 631 of the barrier layer 63 and the carrier 61. In addition, since the portion of the upper surface 611 of the carrier 61 between the recesses 610 may further comprise the wetting layer 69, the glue will be smoothly distributed and the removable/sacrificial layer 67 will be evenly formed between the barriers 63.

With reference to FIG. 6C, an encapsulating material 60 is disposed on the carrier 61 and encapsulates the upper surface 611 of the carrier 61, the stop layers 62, the barrier layers 63, the removable/sacrificial layer 67 and the components 681, 682. That is, the encapsulating material 60 covers the upper surface 611 of the carrier 61, the stop layers 62, the barrier layers 63, the removable/sacrificial layer 67 and the components 681, 682.

With reference to FIG. 6D, portions of the encapsulating material 60 are removed by a laser process and thus portions of the barrier layers 63 are exposed. Thereby, the encapsulating material 60 is divided into three portions 64 and 65, wherein the portions of the encapsulating material 64 are attached to the upper surface 611 of the carrier 61 and the barrier layers 63 and the portion of the encapsulating material 65 is attached to the removable/sacrificial layer 67. In particular, while removing the portions of the encapsulating material 60 by the laser process, the laser will be projected on the barrier layers 63 or on the barrier layers 63 and the stop layers 62 and will not damage the carrier 61.

With reference to FIG. 6E, the removable/sacrificial layer 67 is removed by physical methods or chemical methods, such as a water washing process. Further, the portion of the encapsulating material 65 attached to the removable/sacrificial layer 67 is removed (e.g. while removing the removable/sacrificial layer 67). After removing the removable/sacrificial layer 67 and the portion of the encapsulating material 65, the portions of the encapsulating material 64 remain on the carrier 61 and the portion of the upper surface 61 between the recesses 610 and the wetting layer 69 are exposed. Moreover, a portion of the barrier layer 63 which is protruded from the upper surface 611 of the carrier 61, such as the portion of the side surface 631 above the upper surface 611 of the carrier 61, will be exposed as well. Further, the portions of the encapsulating material 64 are disposed on the upper surface 611 of the carrier 61.

As shown in FIG. 6E, the portion of the encapsulating material 64 may have a side surface 641 standing on the barrier layer 63. In addition, the glue may flow into the space between the side surface 631 of the barrier layer 63 and the carrier 61. Thus, after removing removable/sacrificial layer 67, the entirety of the side surface 631 of the barrier 61 may be exposed.

With reference to FIG. 6F, at least one electronic component 683 is disposed on the portion of the upper surface 61 between the recesses 610.

Figure 7A:
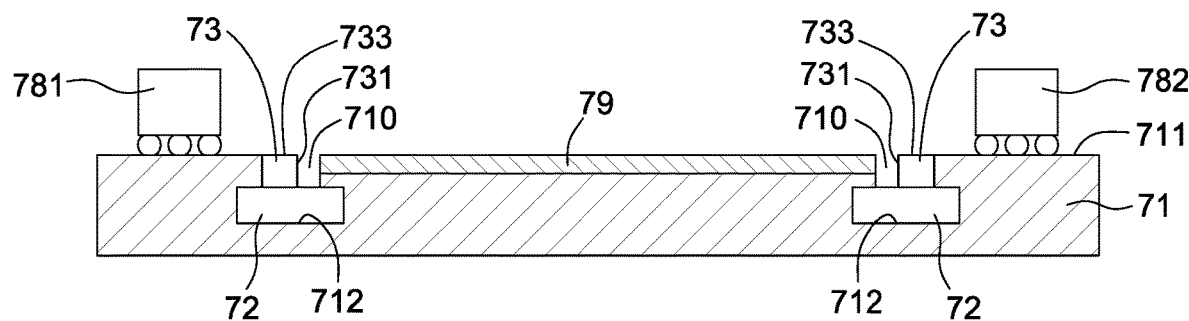
FIG. 7A, FIG. 7B, FIG. 7C, FIG. 7D, FIG. 7E and FIG. 7F show a method of manufacturing a semiconductor device package in accordance with an embodiment of the instant disclosure.
Figure 7B:
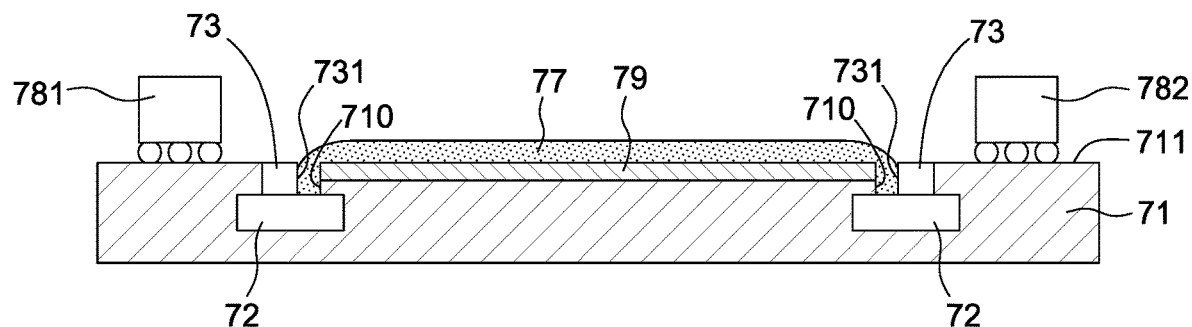
Figure 7C:
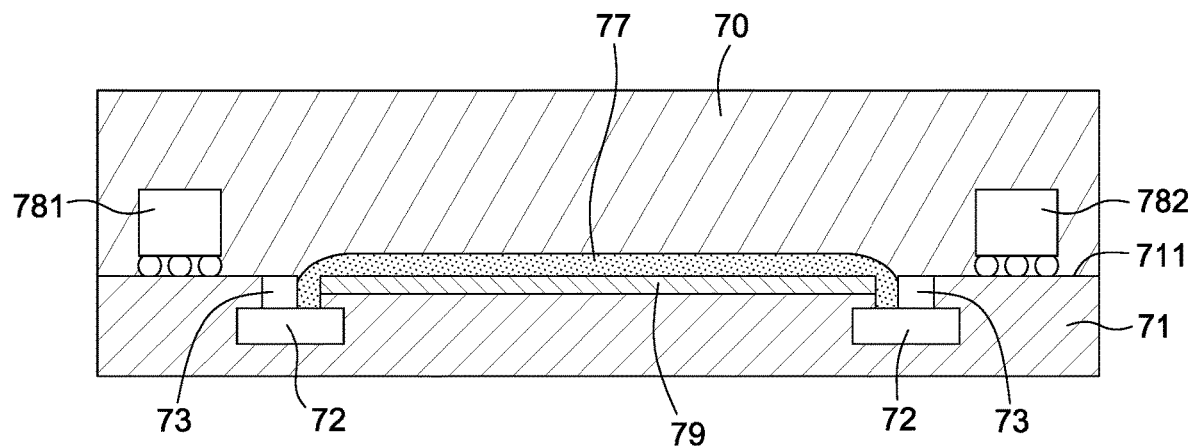
Figure 7D:
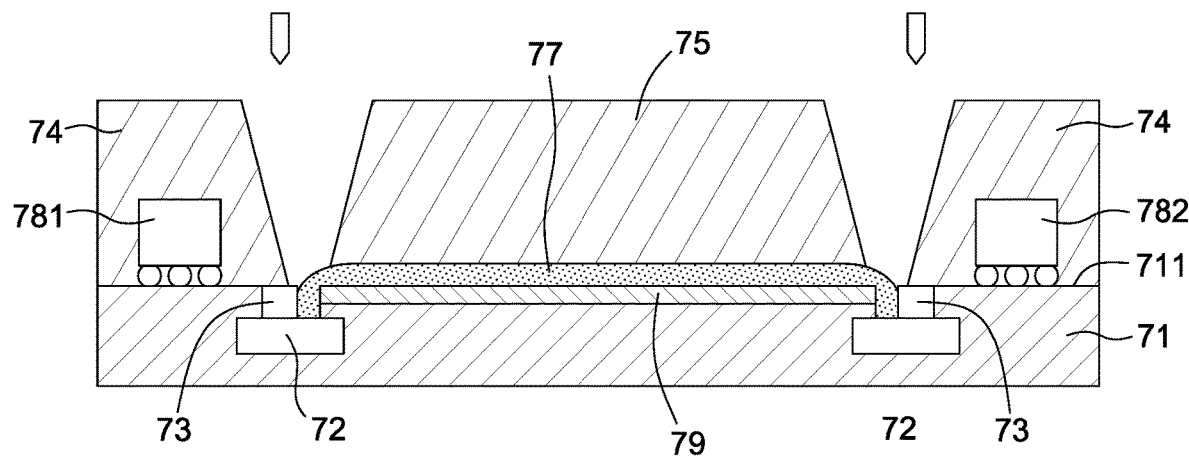
Figure 7E:
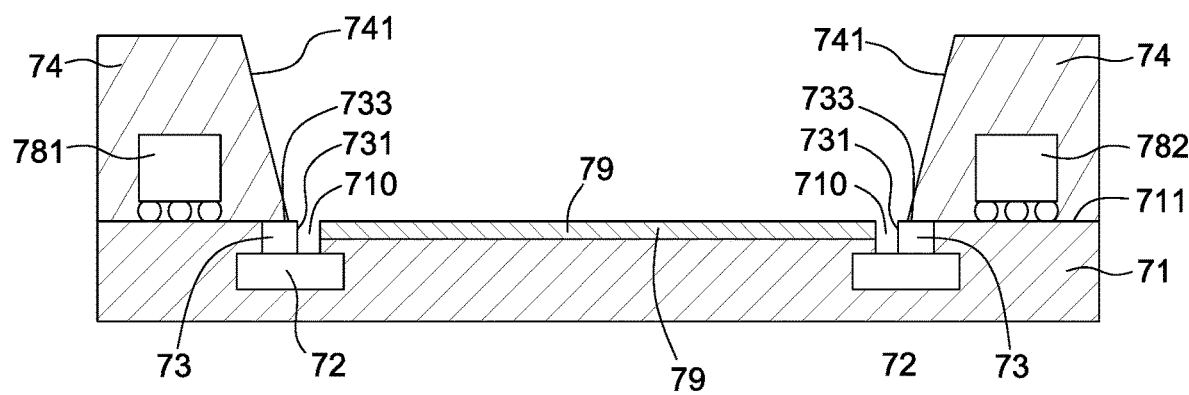
Figure 7F:
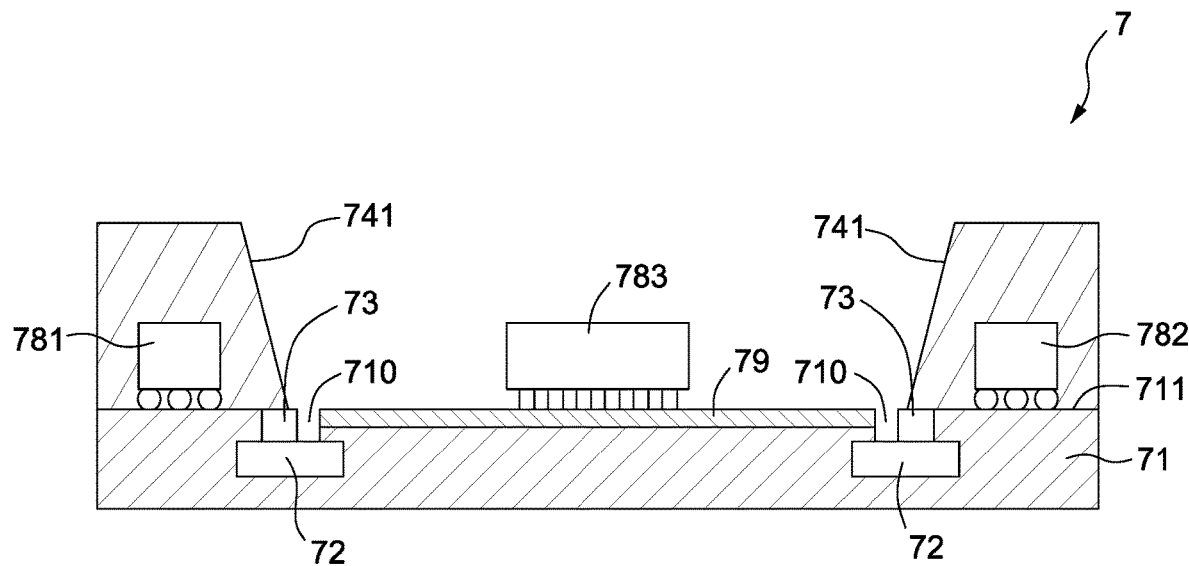

FIG. 7A, FIG. 7B, FIG. 7C, FIG. 7D, FIG. 7E and FIG. 7F show a method of manufacturing a semiconductor device package 7 (as shown in FIG. 7F) in accordance with an embodiment of the instant disclosure. As shown in FIG. 7A, a carrier 71 has an upper surface 711 and two recesses 710 formed in the upper surface 711. The carrier 71 has recessed surfaces 712 (e.g. that defines a bottom of the recess 710) recessed with respect to the upper surface 711. Stop layers 72 may be respectively received within the recesses 710 and thus respectively disposed on the recessed surfaces 712. In other words, the stop layer 72 may be embedded in the carrier 71. A barrier layer 73 may be disposed on the stop layer 72. The barrier layer 73 and the stop layer 72 may be integrated with each other. The barrier layer 73 has a top surface 733 which may be substantially coplanar with the upper surface 711 of the carrier 71. Moreover, the stop layer 72 and the barrier layer 73 may be made of the same material. Referring to FIG. 7A, the cross-sectional width of the stop layer 72 is greater than the cross-sectional width of the barrier layer 73. Especially, the combination of the stop layer 72 and the barrier layer 73 may be substantially inverted T-shaped. At least two electronic components 781, 782 are disposed on the upper surface 711 of the carrier 71.

As shown in FIG. 7A, the barrier layer 73 has a side surface 731 connecting to the upper surface 721 of the stop layer 72. Further, there may be a space between the side surface 731 of the barrier layer 73 and the carrier 71. In addition, the barrier layer 73 may further have a side surface 732 opposite to the side surface 731. The side surface 732 may be substantially attached to the carrier 71. Moreover, a portion of the upper surface 711 of the carrier 71, which is located between the recesses 710, may further comprise a wetting layer 79.

Further, with reference to FIG. 7B, a glue is dispensed on the portion of the upper surface 711 of the carrier 71 between recesses 710. The glue will flow into the space between the side surface 731 of the barrier layer 73 and the carrier 71, and thus the glue will not flow across the barriers 73. That is, the removable/sacrificial layer 77 will be formed between the barriers 73. In addition, since the portion of the upper surface 711 of the carrier 71 between the recesses 710 may further comprise the wetting layer 79, the glue will be smoothly distributed and the removable/sacrificial layer 77 will be evenly formed between the barriers 73.

With reference to FIG. 7C, an encapsulating material 70 is disposed on the carrier 71 and encapsulates the upper surface 711 of the carrier 71, the stop layers 72, the barrier layers 73, the removable/sacrificial layer 77 and the components 781, 782. That is, the encapsulating material 70 covers the upper surface 711 of the carrier 71, the stop layers 72, the barrier layers 73, the removable/sacrificial layer 77 and the components 781, 782.

With reference to FIG. 7D, portions of the encapsulating material 70 are removed by a laser process and thus portions of the barrier layers 73 are exposed. Thereby, the encapsulating material 70 is divided into three portions 74 and 75, wherein the portions of the encapsulating material 74 are attached to the upper surface 711 of the carrier 71 and the barrier layers 73 and the portion of the encapsulating material 75 is attached to the removable/sacrificial layer 77. In particular, while removing the portions of the encapsulating material 70 by the laser process, the laser will be projected on the barrier layers 73 or on the barrier layers 73 and the stop layers 72 and will not damage the carrier 71.

With reference to FIG. 7E, the removable/sacrificial layer 77 is removed by physical methods or chemical methods, such as a water washing process. Further, the portion of the encapsulating material 75 attached to the removable/sacrificial layer 77 is removed (e.g. while removing the removable/sacrificial layer 77). After removing the removable/sacrificial layer 77 and the portion of the encapsulating material 75, the portions of the encapsulating material 74 remain on the carrier 71 and the portion of the upper surface 71 between the recesses 710 and the wetting layer 79 are exposed. Moreover, the side surfaces 731 of the barrier layers 73 will be exposed as well. The portions of the encapsulating material 74 are disposed on the upper surface 711 of the carrier 71 and the top surface 733 of the barrier layer 73. Especially, as shown in FIG. 7E, the portion of the encapsulating material 74 may have a side surface 741 standing on the top surface 733 of the barrier layer 73.

With reference to FIG. 7F, at least one electronic component 783 is disposed on the portion of the upper surface 71 between the recesses 710.

Figure 8A:
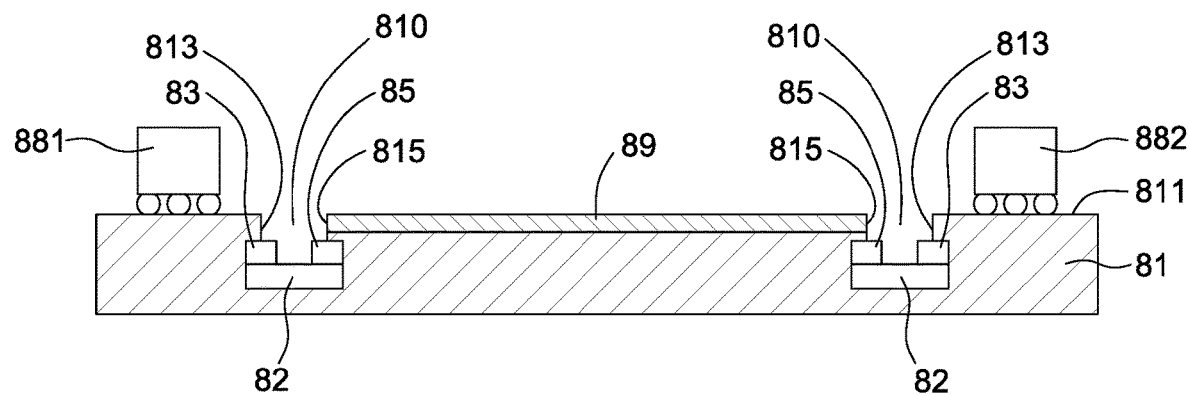
FIG. 8A, FIG. 8B, FIG. 8C, FIG. 8D, FIG. 8E and FIG. 8F show a method of manufacturing a semiconductor device package in accordance with an embodiment of the instant disclosure.
Figure 8B:
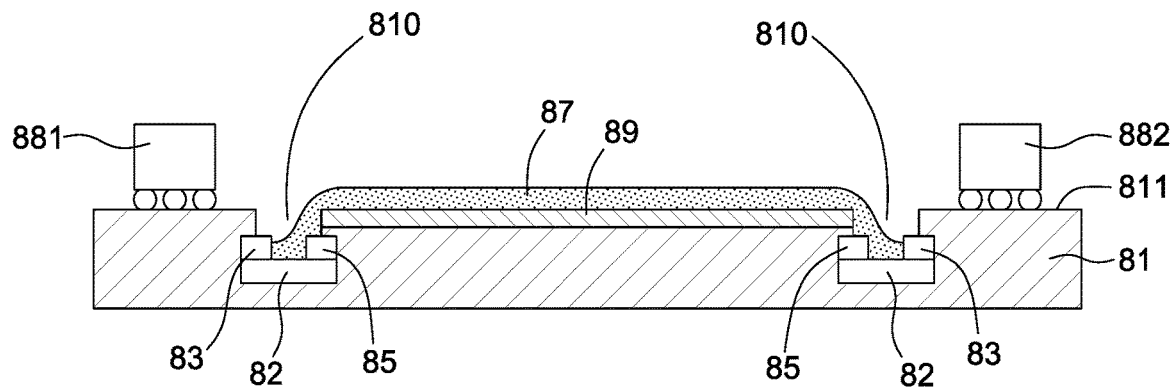
Figure 8C:
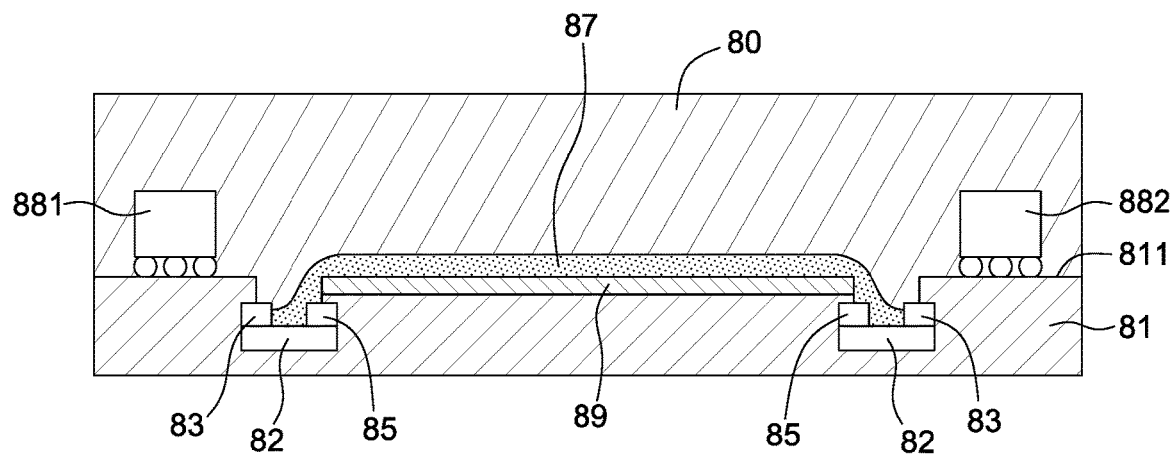
Figure 8D:
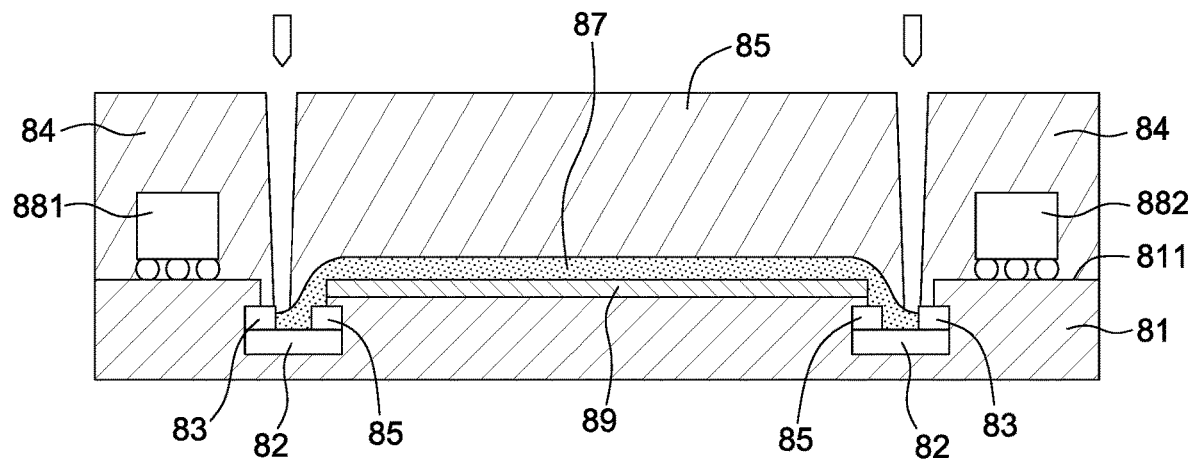
Figure 8E:
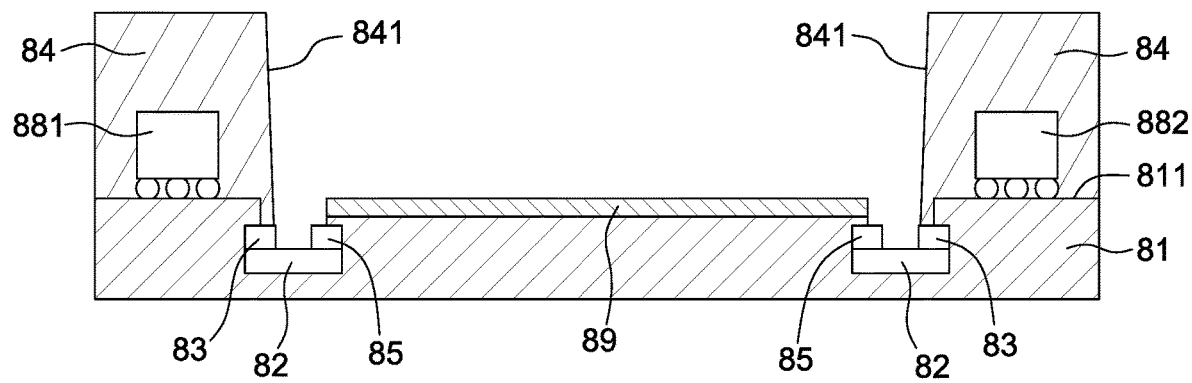
Figure 8F:
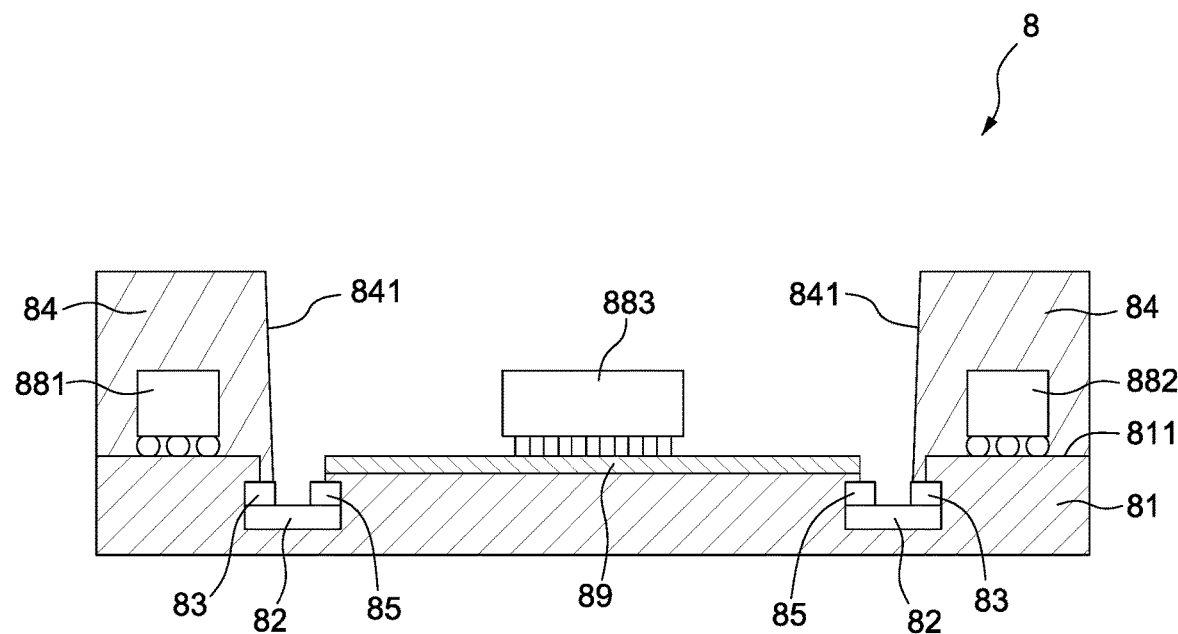

FIG. 8A, FIG. 8B, FIG. 8C, FIG. 8D, FIG. 8E and FIG. 8F show a method of manufacturing a semiconductor device package 8 (as shown in FIG. 8F) in accordance with an embodiment of the instant disclosure. As shown in FIG. 8A, a carrier 81 has an upper surface 811 and two recesses 810 formed in the upper surface 811. The carrier 81 may have recessed surfaces 812 (e.g. that defines a bottom of the recess 810) recessed with respect to the upper surface 811. Stop layers 82 may be respectively received within the recesses 810 and thus respectively disposed on the recessed surfaces 812. In other words, the stop layer 82 may be embedded in the carrier 81. Barrier layers 83 and 85 may be disposed on the stop layer 82. The barrier layers 83 and 85 and the stop layer 82 may be integrated with each other. The recess 810 has two opposite side surfaces 813. 815 connecting to the upper surface 811 of the carrier 81. The side surfaces 813, 815 of the recess 810 stand on the barriers 83, 85 respectively. That is, the top surfaces 833, 853 of the barrier layers 83. 85 are recessed with respect to the upper surface 811 of the carrier 81. Moreover, the stop layer 82 and the barrier layers 83, 85 may be made of the same material. Referring to FIG. 8A, the barrier layers 83 and 85 may be respectively disposed adjacent to two opposite sides of the stop layer 82, and thus the combination of the stop layer 82 and the barrier layers 83 and 85 may be substantially U-shaped. At least two electronic components 881, 882 are disposed on the upper surface 811 of the carrier 81. In addition, a portion of the upper surface 811 of the carrier 81, which is located between the recesses 810, may further comprise a wetting layer 89.

Further, with reference to FIG. 8B, a glue is dispensed on the portion of the upper surface 811 of the carrier 81 between recesses 810. The glue will flow into the recesses 810 but will not flow across the barriers 83. That is, the removable/sacrificial layer 87 will be formed between the barriers 83. In addition, since the portion of the upper surface 811 of the carrier 81 between the recesses 810 may further comprise the wetting layer 89, the glue will be smoothly distributed and the removable/sacrificial layer 87 will be evenly formed between the barriers 83.

With reference to FIG. 8C, an encapsulating material 80 is disposed on the carrier 81 and encapsulates the upper surface 811 of the carrier 81, the stop layers 82, the barrier layers 83, 85, the removable/sacrificial layer 87 and the components 881, 882. That is, the encapsulating material 80 covers the upper surface 811 of the carrier 81, the stop layers 82, the barrier layers 83, the removable/sacrificial layer 87 and the components 881, 882.

With reference to FIG. 8D, portions of the encapsulating material 80 are removed by a laser process and thus portions of the barrier layers 83 are exposed. Thereby, the encapsulating material 80 is divided into three portions 84 and 85, wherein the portions of the encapsulating material 84 are attached to the upper surface 811 of the carrier 81 and the barrier layers 83 and the portion of the encapsulating material 85 is attached to the removable/sacrificial layer 87. In particular, while removing the portions of the encapsulating material 80 by the laser process, the laser will be projected on the barrier layers 83 or on the barrier layers 83 and the stop layers 82 and will not damage the carrier 81.

With reference to FIG. 8E, the removable/sacrificial layer 87 is removed by physical methods or chemical methods, such as a water washing process. Further, the portion of the encapsulating material 85 attached to the removable/sacrificial layer 87 is removed (e.g. while removing the removable/sacrificial layer 87). After removing the removable/sacrificial layer 87 and the portion of the encapsulating material 85, the portions of the encapsulating material 84 remain on the carrier 81 and the portion of the upper surface 81 between the recesses 810 and the wetting layer 89 are exposed. Moreover, portions of the barrier layers 83, 85 will be exposed as well. Further, the portions of the encapsulating material 84 are disposed on the upper surface 811 of the carrier 81.

As shown in FIG. 8E, the portion of the encapsulating material 84 may have a side surface 841 standing on the barrier layer 83. Further, the portion of the encapsulating material 84 may cover the side surface 813 of the recess 810. The barrier layer 83 has a side surface 831 and the barrier layer 85 has a side surface 851 opposite to the side surface 831. Both side surfaces 831, 851 are exposed.

With reference to FIG. 8F, at least one electronic component 883 is disposed on the portion of the upper surface 81 between the recesses 810.

Figure 9A:
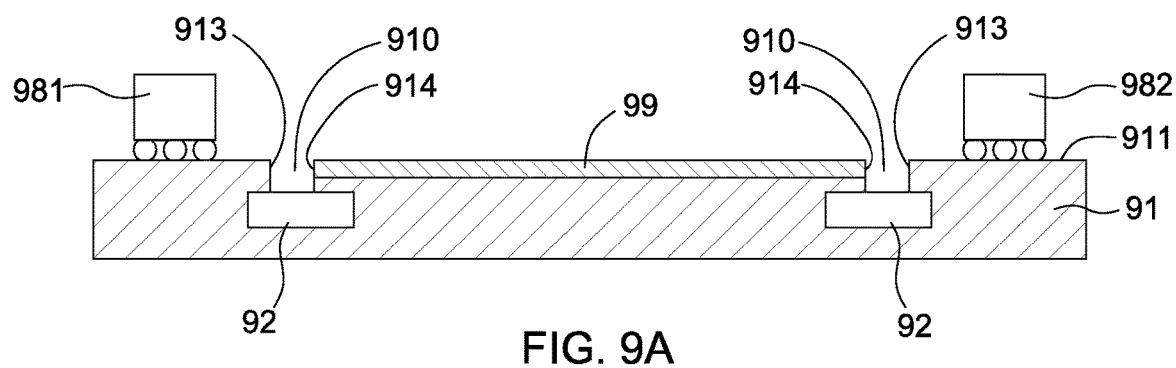
FIG. 9A, FIG. 9B, FIG. 9C, FIG. 9D, FIG. 9E and FIG. 9F show a method of manufacturing a semiconductor device package in accordance with an embodiment of the instant disclosure.
Figure 9B:
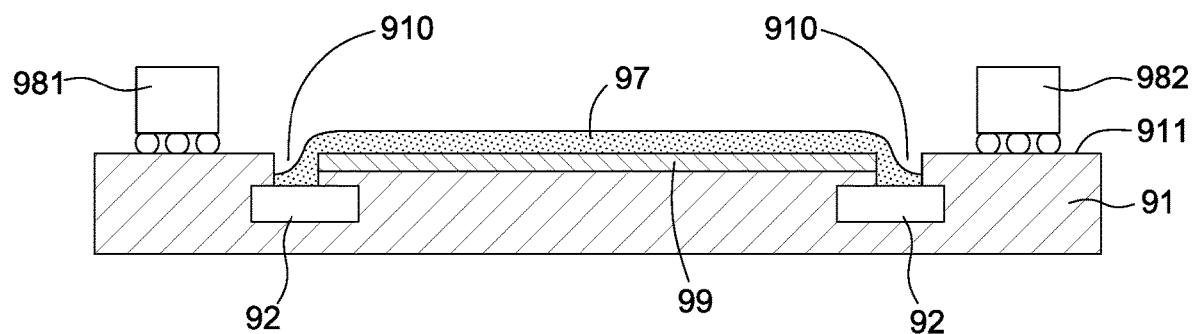
Figure 9C:
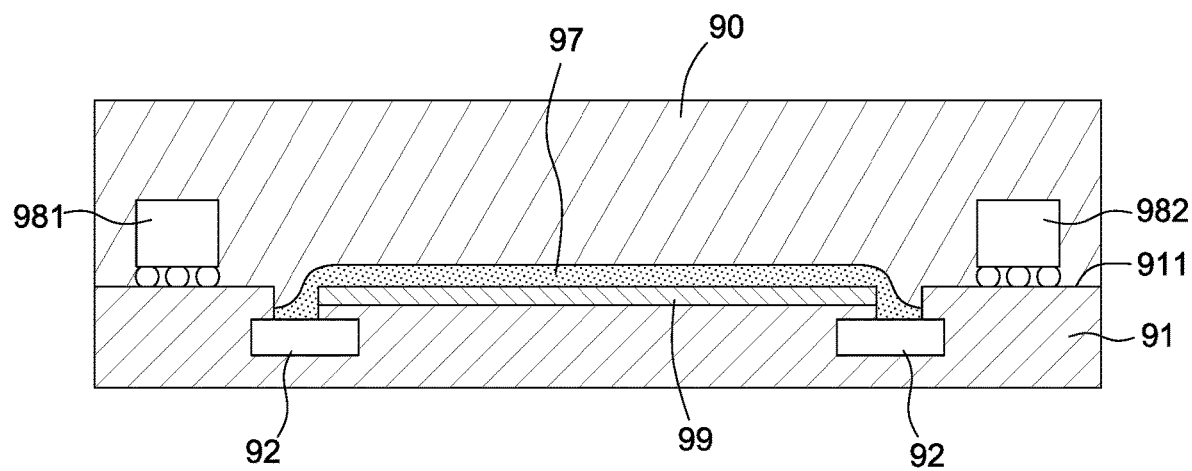
Figure 9D:
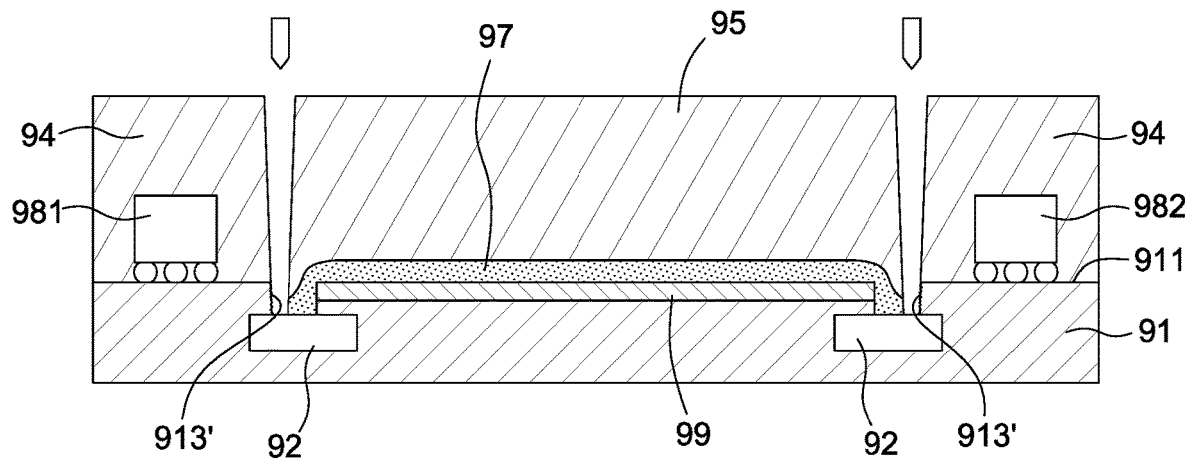
Figure 9E:
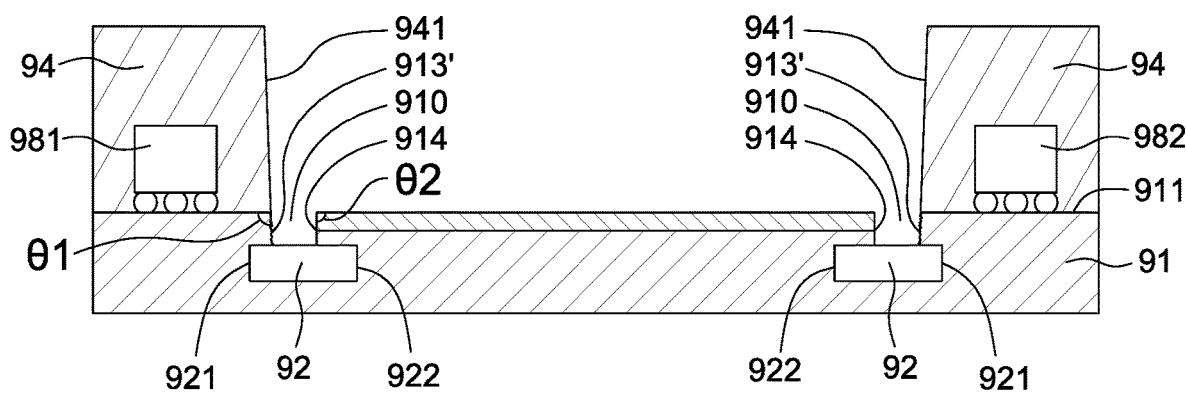
Figure 9F:
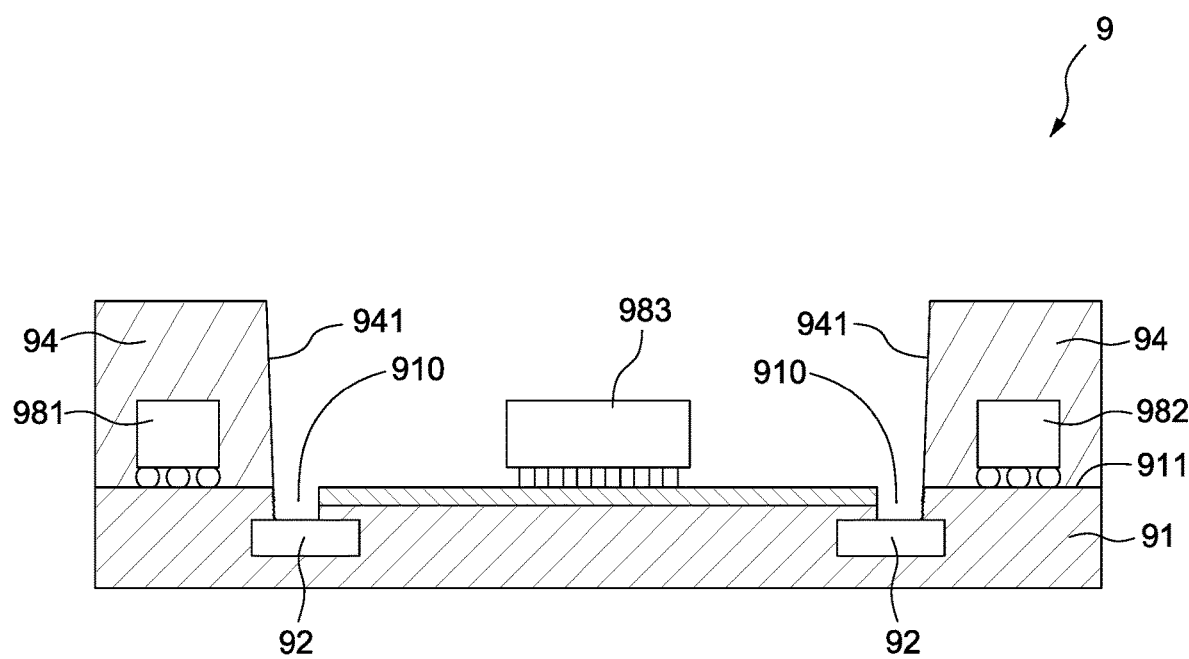

FIG. 9A, FIG. 9B, FIG. 9C, FIG. 9D, FIG. 9E and FIG. 9F show a method of manufacturing a semiconductor device package 9 (as shown in FIG. 9F) in accordance with an embodiment of the instant disclosure. As shown in FIG. 9A, a carrier 91 has an upper surface 911 and two recesses 910 formed in the upper surface 911. The carrier 91 may have recessed surfaces 912 (e.g. that defines a bottom of the recess 910) recessed with respect to the upper surface 911. Stop layers 92 may be respectively received within the recesses 910 and thus respectively disposed on the recessed surfaces 912. That is, the stop layer 92 is embedded in the carrier 91. The recess 910 has two opposite side surfaces 913. 914 connecting to the upper surface 911 of the carrier 91. The side surfaces 913, 914 of the recess 910 stand on the stop layer 92. That is, the top surface 923 of the stop layer 92 is recessed with respect to the upper surface 911 of the carrier 91. The stop layer 92 may have two opposite side surfaces 921 and 922. The distance between the side surface 921 of the stop layer 92 and the side surface 913 of the recess 910 may be identical to the side surface 922 of the stop layer 92 and the side surface 914 of the recess 910. At least two electronic components 981, 982 are disposed on the upper surface 911 of the carrier 91. In addition, a portion of the upper surface 811 of the carrier 91, which is located between the recesses 910, may further comprise a wetting layer 99.

Further, with reference to FIG. 9B, a glue is dispensed on the portion of the upper surface 911 of the carrier 91 between recesses 910. The glue will flow into the recesses 910 but will not flow across the recesses 910. That is, the removable/sacrificial layer 97 will be formed between the side surfaces 913 of the recesses 910. In addition, since the portion of the upper surface 911 of the carrier 91 between the recesses 910 may further comprise the wetting layer 99, the glue will be smoothly distributed and the removable/sacrificial layer 97 will be evenly formed between the recesses 910.

With reference to FIG. 9C, an encapsulating material 90 is disposed on the carrier 91 and encapsulates the upper surface 911 of the carrier 91, the stop layers 92 the removable/sacrificial layer 97 and the components 981, 982. That is, the encapsulating material 90 covers the upper surface 911 of the carrier 91, the stop layers 92, the removable/sacrificial layer 97 and the components 981, 982.

With reference to FIG. 9D, portions of the encapsulating material 90 are removed by a laser process and thus portions of the stop layers 92 are exposed. Especially, the laser may contact a portion of the carrier 91 while removing portions of the encapsulating material 90, and thus the side surface 913' of the carrier 91 will be damaged. Thereby, the encapsulating material 90 is divided into three portions 94 and 95, wherein the portions of the encapsulating material 94 are attached to the upper surface 911 of the carrier 91 and the portion of the encapsulating material 95 is attached to the removable/sacrificial layer 97.

With reference to FIG. 9E, the removable/sacrificial layer 97 is removed by physical methods or chemical methods, such as a water washing process. Further, the portion of the encapsulating material 95 attached to the removable/sacrificial layer 97 is removed (e.g. while removing the removable/sacrificial layer 97). After removing the removable/sacrificial layer 97 and the portion of the encapsulating material 95, the portions of the encapsulating material 94 remain on the carrier 91 and the portion of the upper surface 91 between the recesses 910 and the wetting layer 99 are exposed. Moreover, portions of the stop layers 92 will be exposed as well. Further, the portions of the encapsulating material 94 are disposed on the upper surface 911 of the carrier 91.

As above stated, the laser may contact a portion of the carrier 91 and the side surface 913' of the recess 910 will be damaged, and thus the portion of the encapsulating material 94 may have a side surface 941 which may be coplanar with the damaged side surface 913' of the recess 910. Further, since the side surface 913' of the recess 910 is damaged by the laser, the roughness of the damaged side surface 913' of the recess may be greater than the roughness of the side surface 914 of the recess 910. In addition, the distance between the side surface 921 of the stop layer 92 and the damaged side surface 913' of the recess 910 may be smaller than the distance between the side surface 922 of the stop layer 92 and the side surface 914 of the recess 910. The angle θ1 between the upper surface 911 of the carrier 91 and the damaged side surface 913' of the recess 910 may be greater than 90 degrees and also greater than the angle θ2 between the upper surface 911 of the carrier 91 and the side surface 914 of the recess 910.

With reference to FIG. 9F, at least one electronic component 983 is disposed on the portion of the upper surface 91 between the recesses 910.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

For example, substantially parallel can refer to a range of angular variation relative to 0° of less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, substantially perpendicular can refer to a range of angular variation relative to 90° of less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the instant disclosure has been described and illustrated with reference to specific embodiments thereof, these descriptions and illustrations are not limiting. It should be understood by those skilled in the art that various changes may be made and equivalents may be substituted without departing from the true spirit and scope of the instant disclosure as defined by the appended claims. The illustrations may not be necessarily drawn to scale. There may be distinctions between the artistic renditions in the instant disclosure and the actual apparatus due to manufacturing processes and tolerances. There may be other embodiments of the instant disclosure which are not specifically illustrated. The specification and drawings are to be regarded as illustrative rather than restrictive. Modifications may be made to adapt a particular situation, material, composition of matter, method, or process to the objective, spirit and scope of the instant disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the instant disclosure. Accordingly, unless specifically indicated herein, the order and grouping of the operations are not limitations of the instant disclosure.

What is claimed is:

1. A semiconductor device package, comprising:
   a carrier having a first surface and a second surface recessed with respect to the first surface;
   a conductive layer comprising a stop layer disposed on the second surface of the carrier and a barrier layer disposed on the stop layer and protruded from the first surface of the carrier; and
   an encapsulant disposed on the first surface of the carrier;
   wherein the encapsulant has a side surface disposed on the barrier layer;
   wherein the conductive layer is located between a first area of the carrier which is covered by the encapsulant and a second area of the carrier which is free from being covered by the encapsulant;
   wherein a largest cross-sectional width of the stop layer is greater than a largest cross-sectional width of the barrier layer.

2. The semiconductor device package of claim 1, wherein the stop layer and the barrier layer are made of the same material.

3. The semiconductor device package of claim 1, wherein the barrier layer consists of solder balls.

4. The semiconductor device package of claim 1, wherein the stop layer has a third surface and the barrier layer has a fourth surface connecting the third surface of the stop layer, and wherein a portion of the fourth surface of the barrier layer is exposed.

5. The semiconductor device package of claim 4, wherein the whole fourth surface of the barrier layer is exposed.

6. The semiconductor device package of claim 4, further comprising a space between the fourth surface of the barrier layer and the encapsulant.

7. The semiconductor device package of claim 1, wherein the conductive layer extends from a first side of the carrier to the second side of the carrier.

8. The semiconductor device package of claim 1, wherein the conductive layer is ring-shaped from a top view perspective.

9. A semiconductor device package, comprising:
   a carrier having a first surface and a second surface recessed with respect to the first surface;
   a conductive layer comprising a stop layer disposed on the second surface of the carrier and a first barrier layer disposed on the stop layer and having a third surface coplanar with the first surface or recessed with respect to the first surface; and
   an encapsulant disposed on the first surface of the carrier;
   wherein the encapsulant has a side surface disposed on the third surface of the barrier layer;
   wherein the conductive layer is located between a first area of the carrier which is covered by the encapsulant and a second area of the carrier which is free from being covered by the encapsulant;
   wherein the stop layer has a fourth surface and the first barrier layer has a fifth surface connecting the fourth surface of the stop layer, and wherein the fifth surface of the barrier layer is exposed.

10. The semiconductor device package of claim 9, wherein the stop layer and the first barrier layer are made of the same material.

11. The semiconductor device package of claim 9, wherein the carrier has a sixth surface connected the first surface and covered by the encapsulant.

12. The semiconductor device package of claim 9, wherein the conductive layer further comprises a second barrier layer, and wherein the first and second barrier layers on disposed on the stop layer and respectively adjacent to two opposite sides of the stop layer.

13. The semiconductor device package of claim 12, wherein the first and second barrier layers and the stop layer are made of the same material.

14. The semiconductor device package of claim 12, wherein the carrier has a sixth surface connected the first surface and covered by the encapsulant, and wherein the carrier has a seventh surface opposite to the six surface and disposed on the second barrier layer.

15. A semiconductor device package, comprising:
   a carrier having a first surface, a second surface recessed with respect to the first surface and a third surface connected the first surface;
   a stop layer disposed on the second surface of the carrier;
   an encapsulant disposed on the first surface of the carrier;
   wherein the third surface of the carrier is disposed on the stop layer and the encapsulant has a side surface substantially coplanar with the third surface of the carrier;
   wherein the stop layer is located between a first area of the carrier which is covered by the encapsulant and a second area of the carrier which is free from being covered by the encapsulant;
   wherein the carrier further comprises a fourth surface opposite to the third surface and disposed on the stop layer;
   wherein a roughness of the third surface is greater than a roughness of the fourth surface.

16. The semiconductor device package of claim 15, wherein a distance between the third surface and the fourth surface is smaller than or equal to a cross-sectional width of the stop layer.

17. The semiconductor device package of claim 15, wherein the stop layer comprises a fifth surface which is adjacent to the third surface and a sixth surface which is adjacent to the fourth surface and opposite to the fifth surface, and wherein a distance between the third surface and the fifth surface is smaller than a distance between the fourth surface and the sixth surface.

18. The semiconductor device package of claim 15, wherein an angle between the first surface and the third surface is greater than an angle between the first surface and the fourth surface.

19. The semiconductor device package of claim 15, wherein the stop layer extends from a first side of the carrier to the second side of the carrier.

\* \* \* \* \*